(12) United States Patent
Soyano

(10) Patent No.: US 10,283,440 B2
(45) Date of Patent: May 7, 2019

(54) SEMICONDUCTOR DEVICE AND MANUFACTURING METHOD OF SEMICONDUCTOR DEVICE

(71) Applicant: FUJI ELECTRIC CO., LTD., Kanagawa (JP)

(72) Inventor: Shin Soyano, Shiojiri (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/903,031

(22) Filed: Feb. 23, 2018

(65) Prior Publication Data

US 2018/0182694 A1    Jun. 28, 2018

Related U.S. Application Data

(63) Continuation of application No. PCT/JP2017/002335, filed on Jan. 24, 2017.

(30) Foreign Application Priority Data

Mar. 22, 2016    (JP) .................................. 2016-056455

(51) Int. Cl.
*H01L 23/495*    (2006.01)
*H01L 23/053*    (2006.01)
(Continued)

(52) U.S. Cl.
CPC .... *H01L 23/49575* (2013.01); *G01R 33/0047* (2013.01); *H01L 21/4814* (2013.01);
(Continued)

(58) Field of Classification Search
None
See application file for complete search history.

(56) References Cited

U.S. PATENT DOCUMENTS 9,385,629 B2 * 7/2016 Nagase ................ H05K 7/1432
9,866,213 B1 * 1/2018 Zhang .................... H01L 24/48
(Continued)

FOREIGN PATENT DOCUMENTS

JP    H09-8223 A    1/1997
JP    H11-127583 A    5/1999
(Continued)

OTHER PUBLICATIONS

Shimizu, N., et. al., "V-Series Intelligent Power Modules", Semiconductor Group Fuji Electric Systems Co. Ltd, Oct. 2, 20122 downloaded from URL<https://web.archive.org/web/20121002170706/https://www.fujielectric.com/company/tech/pdf/56-02/FER-56-2-060-2010.pdf> on Sep. 26, 2018.*

(Continued)

*Primary Examiner* — Joseph Schoenholtz

(57) ABSTRACT

A semiconductor device includes: a frame; a first-external-terminal provided to a first side portion of the frame; a first substrate enclosed in the frame and having a first-conductive-layer at an upper surface; a first-semiconductor-element: mounted on the first-conductive-layer; having, on a lower surface, a first main electrode connecting with the first-conductive-layer; and having a second main electrode and a control electrode on an upper surface; a first terminal connecting portion establishing a connection between the first-external-terminal and an exposed portion of the first-conductive-layer between the first-semiconductor-element and the first-external-terminal; a first-external-control-terminal provided above a wire in the frame and between the first main electrode of the first-semiconductor-element and the first-external-terminal; and a first control terminal connecting portion establishing a connection: between the control electrode of the first-semiconductor-element and the first-external-control-terminal; and above a wire between (Continued)

the first main electrode of the first-semiconductor-element and the first-external-terminal.

22 Claims, 13 Drawing Sheets

(51) Int. Cl.
    *H01L 23/498*     (2006.01)
    *H01L 23/373*     (2006.01)
    *G01R 33/00*     (2006.01)
    *H01L 21/64*     (2006.01)
    *H01L 21/48*     (2006.01)
    *H01L 23/14*     (2006.01)
    *H01L 25/07*     (2006.01)
    *H01L 25/18*     (2006.01)
    *H01L 23/24*     (2006.01)

(52) U.S. Cl.
    CPC ............ *H01L 21/64* (2013.01); *H01L 23/053* (2013.01); *H01L 23/14* (2013.01); *H01L 23/3735* (2013.01); *H01L 23/49811* (2013.01); *H01L 25/07* (2013.01); *H01L 25/18* (2013.01); *H01L 23/24* (2013.01); *H01L 2224/48091* (2013.01); *H01L 2224/48095* (2013.01); *H01L 2924/19107* (2013.01)

(56) References Cited

U.S. PATENT DOCUMENTS

| 2001/0030362 | A1* | 10/2001 | Grant ................. H02M 7/003 |
| | | | 257/712 |
| 2014/0015452 | A1* | 1/2014 | Nagase ................ H02M 7/537 |
| | | | 318/139 |
| 2016/0126168 | A1 | 5/2016 | Inoue et al. |
| 2017/0110395 | A1 | 4/2017 | Iwabuchi et al. |

FOREIGN PATENT DOCUMENTS

| JP | 2001-237369 A | 8/2001 |
| JP | 2009-010252 A | 1/2009 |
| JP | 2010-177574 A | 8/2010 |
| JP | 2012-064677 A | 3/2012 |
| JP | 2012-227424 A | 11/2012 |
| JP | 2015-185834 A | 10/2015 |
| WO | 2015/008333 A1 | 1/2015 |

OTHER PUBLICATIONS

International Search Report for International Patent Application No. PCT/JP2017/002335, issued by the Japan Patent Office dated Apr. 18, 2017.

\* cited by examiner

SEMICONDUCTOR DEVICE AND MANUFACTURING METHOD OF SEMICONDUCTOR DEVICE

The contents of the following Japanese patent application are incorporated herein by reference:
No. 2016-056455 filed in JP on Mar. 22, 2016, and PCT/JP2017/002335 filed on Jan. 24, 2017.

BACKGROUND

1. Technical Field

The present invention relates to a semiconductor device and a semiconductor device manufacturing method.

2. Related Art

Conventionally, in an electric power converting device for motor drive or the like, a three-phase output inverter device durable also in a large current/high voltage operation environment is used (refer to Patent Documents 1 and 2, for example). Such an inverter device has a plurality of semiconductor elements as arms to perform switching. Each semiconductor element has a temperature sensing diode, an IGBT (Insulated Gate Bipolar Transistor) element, and the like.

[Patent Document 1] Japanese Patent Application Publication No. 2012-64677
[Patent Document 2] Japanese Patent Application Publication No. 2015-185834

However, in a conventional inverter device, it is necessary to provide P-side and N-side power source terminals and terminals through which large current flows such as an output terminal of each phase, and to provide various types of control terminals used for control of a P-side arm (upper arm) and an N-side arm (lower arm) of each phase, and it is difficult to downsize the device because handling of internal connections to these terminals becomes complicated.

SUMMARY (Item 1)
A first aspect of the present invention provides a semiconductor device. The semiconductor device may include a frame. The semiconductor device may include a first external terminal that is provided to a first side portion of the frame. The semiconductor device may include a first substrate that is enclosed in the frame and has a first conductive layer at an upper surface thereof. The semiconductor device may include a first semiconductor element that: is mounted on the first conductive layer; has, on a lower surface thereof, a first main electrode connecting with the first conductive layer; and has a second main electrode and a control electrode on an upper surface thereof. The semiconductor device may include a first terminal connecting portion that establishes a connection between the first external terminal and an exposed portion of the first conductive layer between the first semiconductor element and the first external terminal. The semiconductor device may include a first external control terminal that is provided above a wire that is in the frame and between the first main electrode of the first semiconductor element and the first external terminal. The semiconductor device may include a first control terminal connecting portion that establishes a connection: between the control electrode of the first semiconductor element and the first external control terminal; and above a wire between the first main electrode of the first semiconductor element and the first external terminal.

(Item 2)
The first control terminal connecting portion may have a bonding wire that establishes an electrical connection between the control electrode of the first semiconductor element and the first external control terminal.

(Item 3)
The first control terminal connecting portion may have a control wiring substrate including a control wiring layer connected to the first external control terminal. The first control terminal connecting portion may have a bonding wire that electrically connects the control electrode of the first semiconductor element and the control wiring layer of the control wiring substrate.

(Item 4)
The first external control terminal may extend from a portion at which the first external control terminal connects with the control wiring substrate and upward above the frame.

(Item 5)
A resin member of the frame may be provided between a lower surface of the control wiring substrate and an upper surface of the first terminal connecting portion.

(Item 6)
An insulating portion of a lower surface of the control wiring substrate may contact an upper surface of the first terminal connecting portion.

(Item 7)
The first semiconductor element may have a plurality of the control electrodes.

Each among a plurality of the first external control terminals electrically connected to each among the plurality of the control electrodes of the first semiconductor element may be provided above at least one among wires between the first main electrode of the first semiconductor element and the first external terminal.

(Item 8)
The bonding wire may be wired in parallel with the first terminal connecting portion when seen in a top view.

(Item 9)
The semiconductor device may further include a second substrate that: is enclosed between a second side portion of the frame that is opposite to the first side portion and the first substrate; and has a second conductive layer at an upper surface thereof. The semiconductor device may further include a second semiconductor element that: is mounted on the second conductive layer; has, on a lower surface thereof, a first main electrode connected to the second conductive layer; and a second main electrode and a control electrode on an upper surface thereof. The second main electrode of the second semiconductor element and the first conductive layer may be electrically connected.

(Item 10)
The semiconductor device may further comprise a second external control terminal provided: above a position between the second side portion of the frame and the second semiconductor element; or to the second side portion.

The semiconductor device may further comprise a second control terminal connecting portion that establishes a connection between the control electrode of the second semiconductor element and the second external control terminal.

(Item 11)
A plurality of sets each having: a first unit including the first external terminal, the first external control terminal, the first semiconductor element, the first terminal connecting portion and the first control terminal connecting portion; and a second unit including the second external control terminal, the second semiconductor element and the second control terminal connecting portion may be arranged in parallel along the first side portion.

(Item 12)

The semiconductor device may include a third external terminal provided to at least one of: a third side portion of the frame between the first side portion and the second side portion; and a fourth side portion opposite to the third side portion. The semiconductor device may include a first conductive plate that is connected to the third external terminal and extends along the first side portion above the first substrate. The semiconductor device may include a fourth external terminal that is provided to at least one of the third side portion and the fourth side portion and closer to the second side portion than the third external terminal is. The semiconductor device may include a second conductive plate that is connected to the fourth external terminal and extends along the second side portion above the second substrate. The second main electrode of the first semiconductor element in each among a plurality of the first units may be electrically connected to the first conductive plate. The second conductive layer in each among a plurality of the second units may be electrically connected to the second conductive plate.

(Item 13)

The first conductive plate may establish a connection between the third external terminal on the third side portion side and the third external terminal on the fourth side portion side. The second conductive plate may establish a connection between the fourth external terminal on the third side portion side and the fourth external terminal on the fourth side portion side.

(Item 14)

The first conductive plate and the second conductive plate may extend in a direction orthogonal to an extending direction of the first terminal connecting portion.

(Item 15)

The semiconductor device may be an inverter device. The first unit may constitute a lower arm of the inverter device. The second unit may constitute an upper arm of the inverter device.

(Item 16)

The semiconductor device may include a third semiconductor element that: is mounted on the first conductive layer of the first substrate in parallel with the first semiconductor element on an opposite side to the first external terminal relative to the first semiconductor element; has, at a lower surface thereof, a first main electrode connecting with the first conductive layer; and has a second main electrode and a control electrode on an upper surface thereof.

The semiconductor device may include a first inter-semiconductor element connecting portion that establishes a connection between the second main electrode of the first semiconductor element and the second main electrode of the third semiconductor element.

(Item 17)

The semiconductor device may include a magnetic core that: is provided to an outer circumference of a wiring portion that is in the first terminal connecting portion and between the exposed portion of the first conductive layer and the first external terminal; and has a gap at part of the outer circumference of the wiring portion. The semiconductor device may include a magnetic sensor arranged at the gap of the magnetic core.

(Item 18)

A second aspect of the present invention provides a semiconductor device manufacturing method. The semiconductor device manufacturing method may include preparing a first substrate having a first conductive layer on an upper surface thereof. The semiconductor device manufacturing method may include preparing a first semiconductor element that: has a first main electrode on a lower surface thereof; and has a second main electrode and a control electrode on an upper surface thereof. The semiconductor device manufacturing method may include mounting the first semiconductor element on the first conductive layer and connecting the first main electrode to the first conductive layer. The semiconductor device manufacturing method may include preparing a frame that is: provided with a first external terminal at a first side portion; and provided with a first external control terminal at a position corresponding to a portion above a wire provided between the first main electrode of the first semiconductor element and the first external terminal. The semiconductor device manufacturing method may include causing the first substrate to be enclosed in the frame. The semiconductor device manufacturing method may include establishing, by a first terminal connecting portion, a connection between: an exposed portion of the first conductive layer between the first semiconductor element and the first external terminal; and the first external terminal. The semiconductor device manufacturing method may include establishing, by a first control terminal connecting portion, a connection: between the control electrode of the first semiconductor element and the first external control terminal; and above a wire between the first main electrode of the first semiconductor element and the first external terminal.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

[1. Outline of Semiconductor Device]

Figure 1:
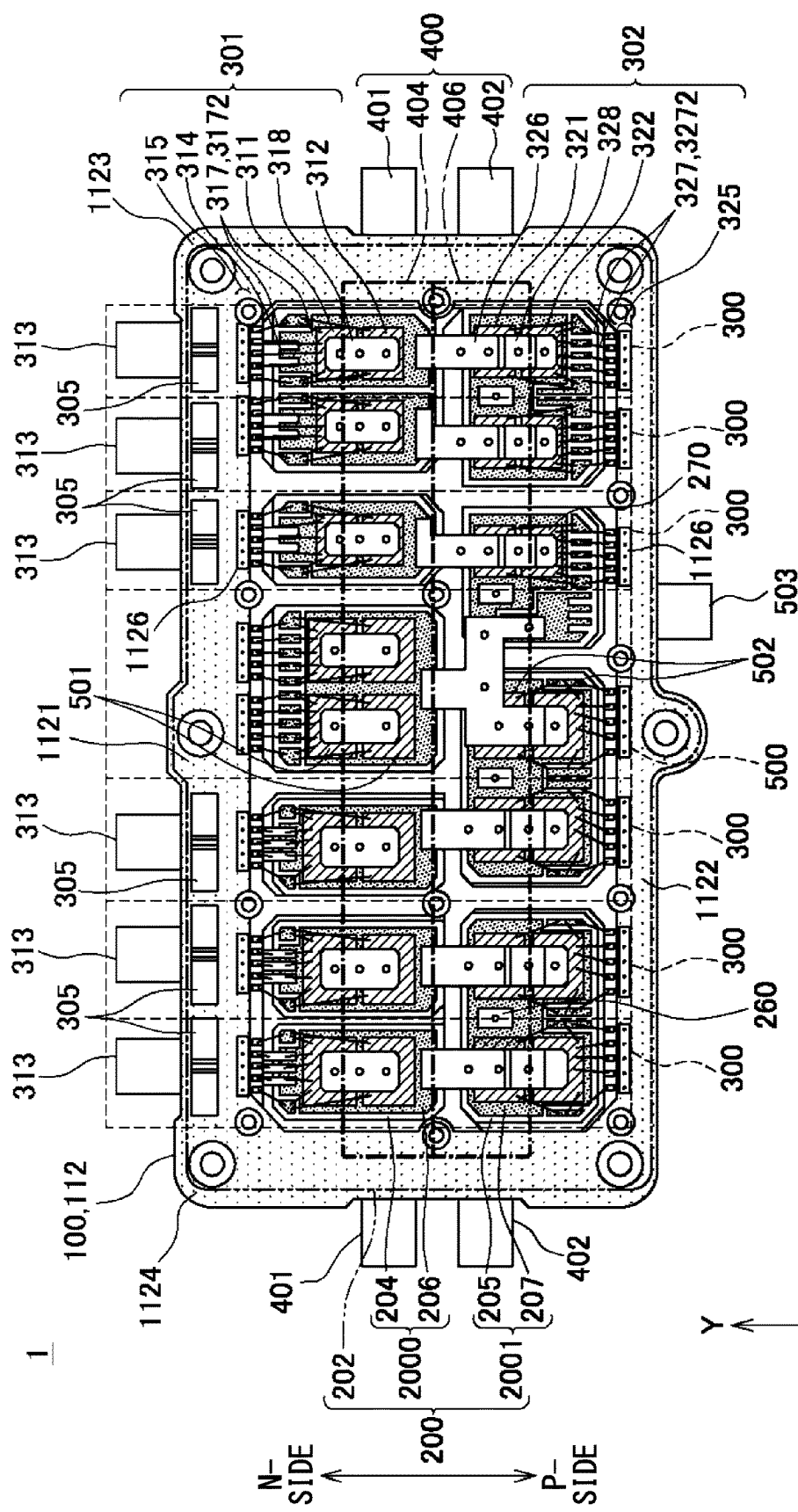
FIG. 1 is a plan view showing a semiconductor device according to the present embodiment.
Figure 2:
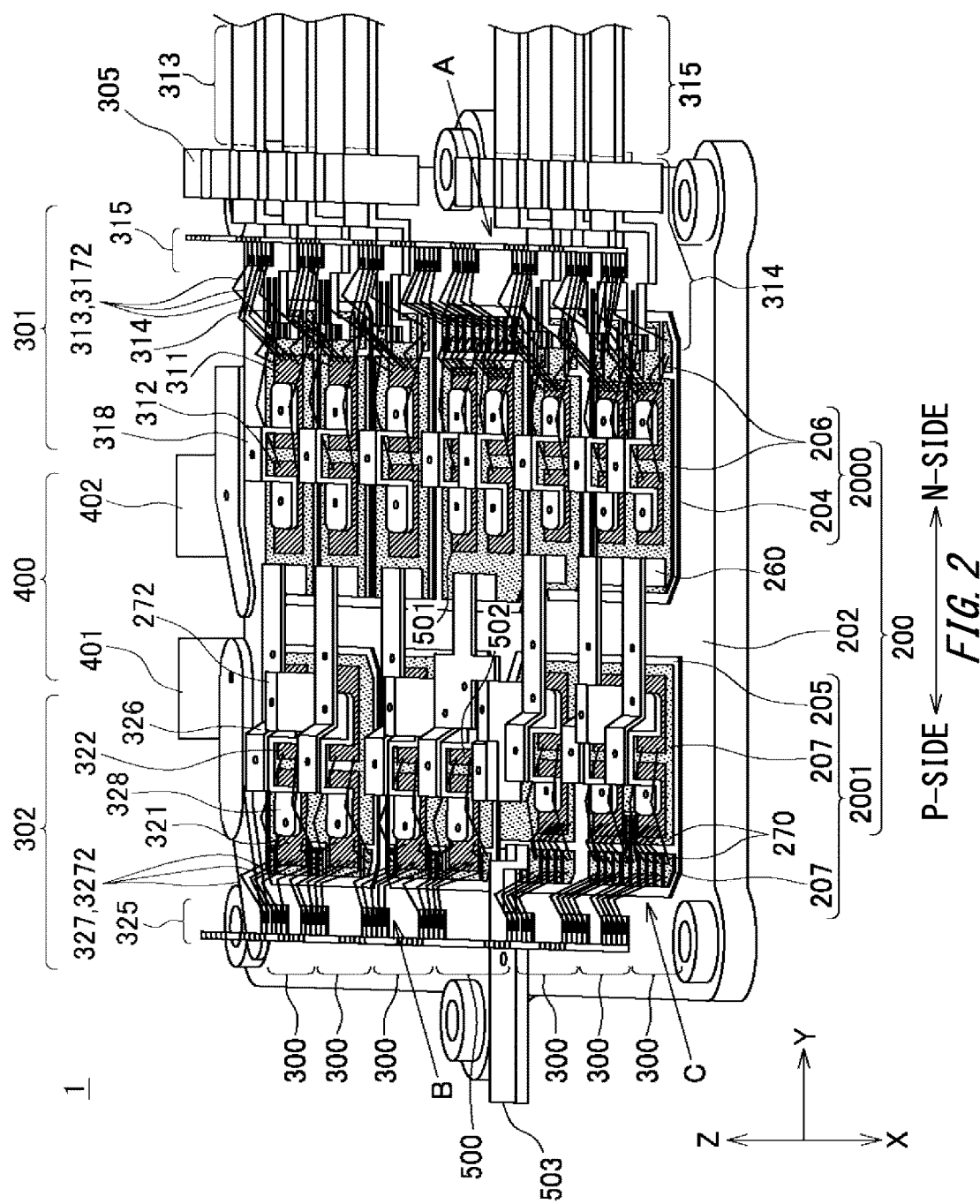
FIG. 2 is a perspective view showing the semiconductor device according to the present embodiment.

FIG. 1 is a plan view showing a semiconductor device 1 according to the present embodiment. Also, FIG. 2 is a perspective view showing the semiconductor device according to the present embodiment.

In the present specification, the X-direction and the Y-direction are perpendicular to each other, and the Z-direction is perpendicular to the X-Y plane. The X-direction, Y-direction and Z-direction constitute a so-called right-handed system. A first semiconductor element of the present example has an upper surface in the +Z-direction, and a lower surface in the −Z-direction. That is, the terms "up" and "above" are associated with the +Z-direction. In contrast to this, the terms "down" and "below" are associated with the −Z-direction. Also, in the present specification, as one example, the +Y-direction is associated with N-side (negative electrode side), and the −Y-direction is associated with P-side (positive electrode side).

As shown in these figures, the semiconductor device 1 includes: a frame 112; N-side substrates 2000 having N-side conductive layers 206 on its upper surface; output terminals 313 provided to the frame 112; N-side semiconductor elements 311 mounted on the N-side conductive layers 206; output terminal connecting portions 314 establishing connections between the N-side conductive layers 206 and the output terminals 313; N-side external control terminals 315; and N-side control terminal connecting portions 317 establishing connections between electrodes of the N-side semiconductor elements 311 and the N-side external control terminals 315. For example, the semiconductor device 1 may include: a case 100 having the frame 112; and one or more legs 300 having: the N-side substrates 2000; the output terminals 313; the N-side semiconductor elements 311; the output terminal connecting portions 314; the N-side external control terminals 315; and the N-side control terminal connecting portions 317. Also, the semiconductor device 1 may further include an electric power supply portion 400 that supplies electric power to the legs 300. This semiconductor device 1 may be an inverter device, as one example.

Among them, the case 100 may be formed into a hollow, flat box-like form, and the one or more legs 300 may be enclosed in the case 100. Also, a plurality of legs 300 may function as one set of arms to perform switching in an inverter device. The plurality of legs 300 may be arrayed in one direction, and for example may be arrayed in the X-direction.

The N-side conductive layers 206 are one example of a first conductive layer, and the N-side substrates 2000 are one example of a first substrate. Also, the output terminals 313 are one example of a first external terminal, and the output terminal connecting portions 314 are one example of a first terminal connecting portion. Also, the N-side semiconductor elements 311 are one example of a first semiconductor element. Also, the N-side external control terminals 315 are one example of a second external control terminal, and the N-side control terminal connecting portions 317 are one example of a first control terminal connecting portion.

[1-1. Case]

The case 100 has the frame 112 (refer to FIG. 1) in a frame-like form, and for example is formed of resin such as polyphenylene sulfide (PPS) or polybutyrene telephthalate (PBT). In FIG. 1, the frame 112 is hatched, and in FIG. 2, illustration of the frame 112 is omitted.

As shown in FIG. 1, the frame 112 includes a first side portion 1121, a second side portion 1122, a third side portion 1123 and a fourth side portion 1124. Among them, the first side portion 1121 and the second side portion 1122 are opposite to each other, and preferably are parallel with the X-direction, respectively. Also, the third side portion 1123 and the fourth side portion 1124 are opposite to each other, and preferably are parallel with the Y-direction, respectively, and are orthogonal to the first side portion 1121 and the second side portion 1122. In the present embodiment, the first side portion 1121 and the second side portion 1122 are longer than the third side portion 1123 and the fourth side portion 1124. Rectangular parallelepiped resin blocks 1126 (refer to FIG. 1) which respective N-side external control terminal 315 and respective P-side external control terminal 325 in legs 300 mentioned below penetrate may be arranged on the upper surfaces of the first side portion 1121 and the second side portion 1122. The P-side external control terminals 325 are one example of a second external control terminal.

Figure 7A:
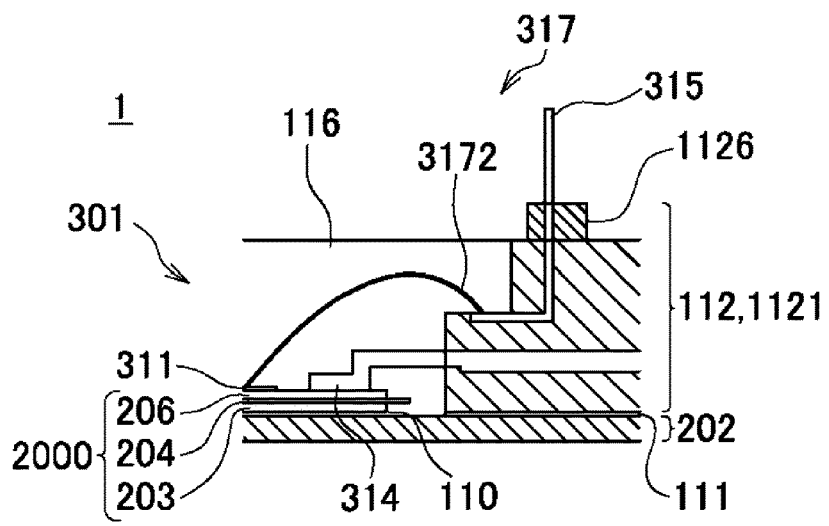
FIG. 7A is a cross-sectional view of a first side portion side in the semiconductor device.
Figure 7B:
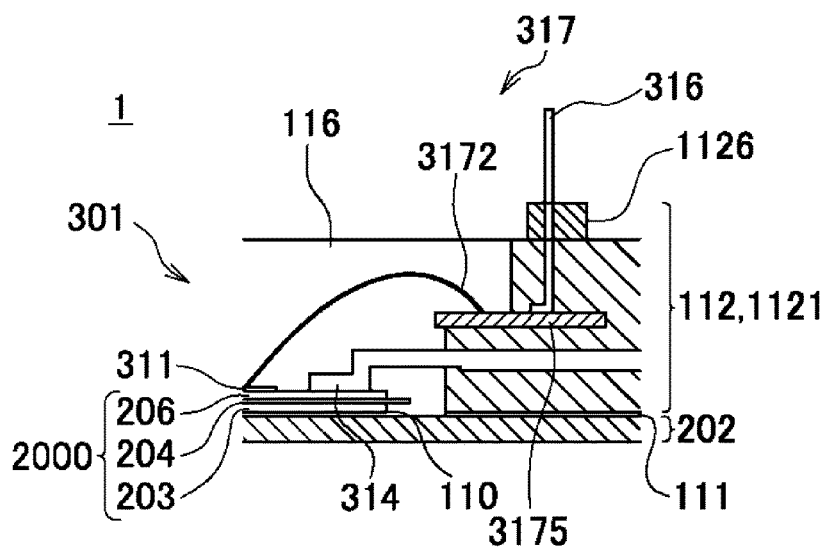
FIG. 7B is a cross-sectional view of the first side portion side in the semiconductor device.
Figure 7C:
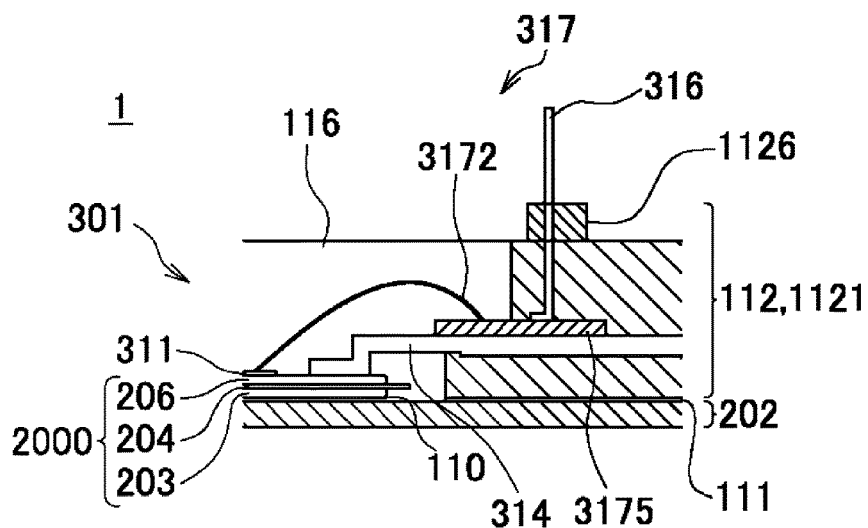
FIG. 7C is a cross-sectional view of the first side portion side in the semiconductor device.

The case 100 may have a lid portion (not illustrated) above the frame 112. This lid portion covers and protects the space inside the case 100. If the space inside the case 100 is filled with a sealing material 116 as shown in FIGS. 7A to 7C mentioned below, the lid portion may prevent such a sealing material 116 from leaking out of the case 100. Here, the sealing material 116 may be gelled or solidified. The gelled sealing material 116 used can be silicone gel or the like, and the solidified sealing material 116 used can be epoxy resin or the like. The lid portion may be a substrate on which another unillustrated semiconductor element or semiconductor chip is mounted.

[1-2. Legs]

A plurality of legs 300 are arranged in parallel along the first side portion 1121 and the second side portion 1122 as shown in FIG. 1. As shown in FIGS. 1 and 2, each leg 300 has a set of an N-side unit 301 and a P-side unit 302 as arms to perform switching and a substrate portion 200. Among them, the N-side unit 301 may constitute a lower arm connected to a negative terminal of a power source, and the P-side unit 302 may constitute an upper arm connected to a positive terminal of the power source. Also, the N-side unit 301 may be arranged on the first side portion 1121 side (refer to FIG. 1), that is, the +Y-side, and the P-side unit 302 may be arranged on the second side portion 1122 side (refer to FIG. 1), that is, the −Y-side. The N-side unit 301 is one example of a first unit, and the P-side unit is one example of a second unit.

For example, three legs 300 may constitute one set. As one example, six legs 300 are included in the semiconductor device 1, forming two sets. Three legs 300 included in such a set output U-phase, V-phase and W-phase AC signals from three output terminals 313. However, a different number of legs 300 may be included in the semiconductor device 1, and legs 300 may have other functions.

P-side units 302 as upper arms of legs 300 may not be included in the semiconductor device 1. If P-side units 302 are not included in the semiconductor device 1, P-side units 302 are formed as instruments external to the semiconductor device 1, and the N-side units 301 included in the semiconductor device 1 and the P-side units 302 as the external instruments may be connected for use.

[1-2-1. Substrate Portion]

The substrate portion 200 has one or more N-side substrates 2000 that are enclosed in the frame 112 (refer to FIG. 1) and have upper surfaces on which one or more N-side conductive layers 206 are formed. Also, the substrate portion 200 may have one or more P-side substrates 2001 that are enclosed between the second side portion 1122 of the frame 112 (refer to FIG. 1) and the N-side substrates 2000 and have upper surfaces on which one or more P-side conductive layers 207 are formed.

The P-side conductive layers 207 are one example of a second conductive layer, and the P-side substrates 2001 are one example of a second substrate. An N-side substrate 2000 and a P-side substrate 2001 may be provided for each leg 300, or they may be substrates shared by a plurality of legs 300. Also, an N-side substrate 2000 and a P-side substrate 2001 may be an N-side portion and a P-side portion of a substrate shared by the N-side units 301 and the P-side units 302.

The N-side substrates 2000 have insulating substrates 204, and the one or more N-side conductive layers 206 arranged on the insulating substrates 204. The P-side substrates 2001 have insulating substrates 205, and a plurality of P-side conductive layers 207 arranged on the insulating substrates 205. For example, the N-side substrates 2000 and the P-side substrates 2001 may be arrayed along the Y-direction, and the N-side substrates 2000 are positioned on the +Y-direction side of the P-side substrate 2001.

The insulating substrates 204, 205, and the N-side conductive layers 206 and the P-side conductive layers 207 may be integrated together by directly joining or brazing them. In FIGS. 1 and 2, the N-side conductive layers 206 and the P-side conductive layers 207, and N-side semiconductor elements 311, 312 and P-side semiconductor elements 321, 322 mentioned below are hatched. The N-side semiconductor elements 312 are one example of a third semiconductor element.

An insulating substrate 204 supports one or more N-side conductive layers 206 thereon, and electrically insulates the N-side conductive layers 206 from an underlying member, for example a heat sink 202 mentioned below. Likewise, an insulating substrate 205 supports one or more P-side conductive layers 207 thereon, and electrically insulates the P-side conductive layers 207 from an underlying member, for example the heat sink 202 mentioned below. For example, the insulating substrates 204, 205 may be ceramic plates.

The N-side conductive layers 206 and the P-side conductive layers 207 are formed of conductive metal such as copper and into a circuit-like form, for example into the form like a plurality of lands. Among them, the N-side conductive layers 206 are formed on the insulating substrates 204, and the P-side conductive layers 207 are formed on the insulating substrates 205. The N-side conductive layers 206 and the P-side conductive layers 207 may be formed elongated in the Y-direction so as to mount a plurality of the N-side semiconductor elements 311, 312 and P-side semiconductor elements 321, 322 in parallel in the Y-direction. Also, the N-side conductive layers 206 and the P-side conductive layers 207 may be formed into a line-like form.

The heat sink 202 to cool the legs 300 may be provided to the lower surface side of the N-side substrates 2000 and the P-side substrates 2001. Although the heat sink 202 is illustrated in FIGS. 1 and 2, it is illustrated with a two-dot chain line in FIG. 1.

The heat sink 202 may cover the inner bottom surface of the case 100, and may support, at different regions and from below, the N-side substrates 2000 and the P-side substrates 2001. Also, the heat sink 202 may be sheet copper. The heat sink 202 and the insulating substrates 204, 205 may be joined by soldering or the like. As shown in FIGS. 7A to 7C mentioned below, a heat transfer layer 203 made of metal such as copper may be provided between the heat sink 202 and an insulating substrate 204 and between the heat sink 202 and an insulating substrate 205. This heat transfer layer 203 and the insulating substrates 204, 205 may be integrated together by directly joining or brazing them.

[1-2-2. N-Side Units]

Each N-side unit 301 includes: N-side semiconductor elements 311; output terminal connecting portions 314; one or more N-side external control terminals 315; and N-side control terminal connecting portions 317. Also, the N-side unit 301 may include one or more N-side semiconductor elements 312 in parallel with the N-side semiconductor elements 311 so as to be adapted to large current.

[1-2-2(1). N-Side Semiconductor Elements]

The N-side semiconductor elements 311, 312 are mounted on the N-side conductive layers 206. For example, the N-side semiconductor elements 312 are provided in parallel with the N-side semiconductor elements 311 on the opposite side to the first side portion 1121, that is, in the −Y-direction, relative to the N-side semiconductor element 311. These N-side semiconductor elements 311, 312 have first main electrodes on their respective lower surfaces, and second main electrodes and one or more control electrodes on their respective upper surfaces. Then, the first main electrodes on the lower surfaces of the N-side semiconductor elements 311, 312 are electrically and mechanically bonded to the N-side conductive layers 206 by soldering and the like. Each control electrode is an electrode for controlling turn-on/off or a resistance value between main electrodes, or monitoring (sensing) voltage or temperature of the main electrodes. This control electrode may have a smaller area than those of the main electrodes, and current that flows therethrough is smaller than current that flows through the main electrodes.

Here, in the present embodiment, the first semiconductor elements 311, 312 are vertical semiconductor chips in which switching elements such as power MOSFETs or IGBTs are formed or semiconductor chips in which diode elements are formed. The N-side semiconductor elements 311 or the like may be semiconductor chips in which RC-IGBTs having both switching elements and diode elements are formed. More specifically, as mentioned in detail below using FIG. 11, the N-side semiconductor elements 311, 312 are semiconductor chips on which temperature sensing diodes, RC-IGBT (Reverse Conducting IGBT) elements and the like are mounted. This type of semiconductor chips has a collector electrode of an RC-IGBT element as a first main electrode. Also, the semiconductor chip has an emitter electrode of an IGBT element as a second main electrode. Also, the semiconductor chip has, as a plurality of control electrodes, a gate electrode, sense-emitter electrode and Kelvin emitter electrode of an RC-IGBT element, and an anode electrode and cathode electrode of a temperature sensing diode. Here, the sense-emitter electrode is an electrode for extracting and measuring part of emitter current. The substrate of the semiconductor chip may be made of silicon, silicon carbide or gallium nitride.

However, the first main electrodes, the second main electrodes and the control electrodes may be other electrodes in the above-mentioned semiconductor chips. Also, the N-side semiconductor elements 311, 312 may be semiconductor elements having other circuit configurations. The N-side semiconductor elements 311, 312 may be different types of elements from each other.

In the N-side semiconductor elements 311, 312, the first main electrodes (collector electrodes) on their lower surfaces are electrically connected to the N-side conductive layers 206 as mentioned above.

Also, in the N-side semiconductor elements 311, 312, the control electrodes (gate electrodes, Kelvin emitter electrodes, sense-emitter electrodes, anode electrodes and cathode electrodes) on their upper surfaces are, as mentioned in detail below, electrically connected to the N-side external control terminals 315 through the N-side control terminal connecting portions 317.

Also, in the N-side semiconductor elements 311, 312, electrical connections are established between the second main electrodes on their upper surfaces by N-side inter-element connecting portions 318 such as jumper terminals. An N-side conductive plate 404 in the electric power supply portion 400 mentioned below is electrically connected to the N-side inter-element connecting portions 318. The N-side inter-element connecting portions 318 may be formed by pressing metal plates. For example, as shown in FIG. 2, an N-side inter-element connecting portion 318 may include: two plate portions to closely adhere to first main electrodes (emitter electrodes) on the upper surfaces of respective N-side semiconductor elements 311, 312; an upper plate portion to closely adhere to the lower surface of the N-side conductive plate 404; and two plate portions to establish connections between the lower plate portions and the upper plate portion. The N-side inter-element connecting portions 318 are one example of a first inter-element connecting portion. Also, the N-side conductive plate 404 is one example of a first conductive plate, and may be connected to a negative electrode of a power source.

[1-2-2(2). N-Side External Control Terminals and N-Side Control Terminal Connecting Portions]

The N-side external control terminals 315 and the N-side control terminal connecting portions 317 establish conductive paths from control terminals (gate electrodes, Kelvin emitter electrodes, sense-emitter electrodes, anode electrode and cathode electrodes) of the N-side units 301 and out of the case 100 as shown in FIGS. 1 and 2. Because in the present embodiment, an N-side unit 301 has five control electrodes, five sets of the N-side external control terminals 315 and the N-side control terminal connecting portions 317 may each be connected to any of the control electrodes.

Among them, the N-side external control terminals 315 for example are formed of conductive metal and into a pin-like form, and are arranged with middle portions thereof being embedded into the first side portion 1121 (refer to FIG. 1). Also, an N-side external control terminal 315 has one end portion extending from the first side portion 1121 and a resin block 1126 and upward above the case 100, and connected to an external instrument ((not illustrated). Also, the other end portion of the N-side external control terminal 315 is bent to extend from the first side portion 1121 into the case 100. The conductive metal used can be for example copper, a copper alloy (brass, phosphor bronze, C194 copper alloy, etc.), aluminum, a copper-aluminum clad material or the like as a conductive material.

The N-side control terminal connecting portions 317 establish electrical connections between the control electrodes (gate electrodes, Kelvin emitter electrodes, sense-emitter electrodes, anode electrodes and cathode electrodes) of the N-side units 301 and the other end portions of the N-side external control terminals 315. For example, an N-side control terminal connecting portion 317 may have a bonding wire 3172 such as aluminum electrically and mechanically connected to the control electrodes of the N-side unit 301. However, an N-side control terminal connecting portion 317 may have, in place of the bonding wire 3172, a plate formed by bending a conductive metal plate. Connections between the N-side control terminal connecting portions 317 and the N-side semiconductor elements 311, 312 are mentioned in detail below using FIGS. 4, and 7A to 7C.

[1-2-2(3). Output Terminals]

The output terminals 313 are formed of conductive metal and provided to the first side portion 1121 of the frame 112 (refer to FIG. 1) so as to connect the semiconductor device 1 to an external instrument. For example, the output terminals 313 may be provided to the outer surface of the first side portion 1121 and extend out of the frame 112.

The output terminals 313 may be formed to be wide along the X-direction as long as they do not abut against output terminals 313 of adjacent legs 300. For example, if a plurality of N-side external control terminal 315 are included in a leg 300, the output terminals 313 may be formed to be wider than the overall width of the plurality of N-side external control terminal 315 in the X-direction. As one example, an output terminal 313 may be formed to be wider in the X-direction than a resin block 1126 which a plurality of N-side external control terminals 315 penetrate (refer to FIG. 1). With the output terminals 313 being formed to be wide in this manner, heat generation at the output terminals 313 can be reduced, and large current is allowed to flow.

[1-2-2(4). Output Terminal Connecting Portions]

The output terminal connecting portions 314 are formed of conductive metal, and establish connections between: exposed portions of the N-side conductive layers 206 between: the N-side semiconductor elements 311, 312; and the output terminals 313; and the output terminals 313. The exposed portions of the N-side conductive layers 206 are portions that can electrically connect with other members, and may for example be portions not covered by the N-side semiconductor elements 311, 312 and conductive terminals 260 mentioned below, and either be sealed or not sealed by the sealing material 116.

For example, the output terminal connecting portions 314 are provided penetrating the first side portion 1121 from the exposed portions of the N-side conductive layers 206 inside the case 100, and are electrically connected to the output terminals 313 at the outer surface of the first side portion 1121 (refer to the right end portion in FIG. 2). The output terminal connecting portions 314 may be formed of conductive metal and integrally together with the output terminals 313. Also, end portions of the output terminal connecting portions 314 that are opposite to the output terminal 313, that is, end portions inside the case 100, may be electrically and mechanically connected to the N-side conductive layers 206.

As one example, the output terminal connecting portions 314 may be formed by pressing metal plates. Specifically, as shown in FIG. 2, an output terminal connecting portion 314 may include: a plate portion to closely adhere to an exposed portion of an N-side conductive layer 206; a plate portion to penetrate the first side portion 1121; and a connecting portion that establishes a connection between the plate portions across a space between the exposed portion of the N-side conductive layer 206 to the first side portion 1121.

The output terminal connecting portions 314 may extend in the Y-direction as shown in FIGS. 1 and 2. Also, the output terminal connecting portions 314 may be formed to be wide along the X-direction, in a similar manner to that for the output terminal 313. With the output terminal connecting portions 314 being formed to be wide in this manner, heat generation at the output terminal connecting portions 314 can be reduced, and large current is allowed to flow.

Magnetic sensor portions 305 may be provided to wiring portions which are in the output terminal connecting portions 314 and between the exposed portions of the N-side conductive layers 206 and the output terminals 313. These magnetic sensor portions 305 are mentioned in detail below using FIGS. 9 and 10.

[1-2-3. P-Side Units]

Each P-side unit 302 includes: P-side semiconductor elements 321; one or more P-side external control terminals 325; and P-side control terminal connecting portions 327. Also, the P-side unit 302 may include P-side semiconductor elements 322 in parallel with the P-side semiconductor elements 321 so as to be adapted to large current. The P-side semiconductor elements 321 are one example of a second semiconductor element, and the P-side control terminal connecting portions 327 are one example of a second external control terminal.

[1-2-3(1). P-Side Semiconductor Elements]

The P-side semiconductor elements 321, 322 are mounted on the P-side conductive layers 207. For example, the P-side semiconductor elements 322 are provided in parallel with the P-side semiconductor elements 321 on the first side portion 1121 side relative to the P-side semiconductor element 321. These P-side semiconductor elements 321, 322 have first main electrodes on their respective lower surfaces, and second main electrodes and one or more control electrodes on their respective upper surfaces. Then, the first main electrodes on the lower surfaces of the P-side semiconductor elements 321, 322 are electrically and mechanically connected to the P-side conductive layers 207 by soldering or the like. Here, although in the present embodiment, the P-side semiconductor elements 321, 322 are elements similar to the N-side semiconductor elements 311, respectively, they may be a different type of elements from the N-side semiconductor elements 311. The P-side semiconductor elements 321 and the P-side semiconductor elements 322 may be mutually different types of elements.

In the P-side semiconductor elements 321, 322, the first main electrodes (collector electrodes) on their lower surfaces are electrically connected to the P-side conductive layers 207 as mentioned above. Thereby, as mentioned in detail below, the first main electrodes (collector electrodes) of the P-side semiconductor elements 321, 322 are electrically connected to a P-side conductive plate 406 mentioned below through the P-side conductive layers 207 and the like. This P-side conductive plate 406 is one example of a second conductive plate, and may be connected to a positive electrode of a power source.

Also, in the P-side semiconductor elements 321, 322, the control electrodes (gate electrodes, Kelvin emitter electrodes, sense-emitter electrodes, anode electrodes and cathode electrodes) on their upper surfaces are electrically connected to the P-side control terminal connecting portions 327.

Also, in the P-side semiconductor elements 321, 322, the second main electrodes (emitter electrodes) on their upper surfaces are electrically connected to the N-side conductive layers 206 arranged under the N-side semiconductor elements 311, 312. For example, electrical connections may be established between the second main electrodes (emitter electrodes) of the P-side semiconductor elements 321, 322 by P-side inter-element connecting portions 328 such as jumper terminals. Also, the conductive terminals 260 (refer to FIG. 2) may be arranged in the N-side conductive layers 206 arranged under the N-side semiconductor elements 311, 312. Then, the P-side inter-element connecting portions 328 and the conductive terminals 260 may be electrically connected by jumper terminals 326.

[1-2-3(2). P-Side External Control Terminals and P-Side Control Terminal Connecting Portions]

The P-side external control terminals 325 and the P-side control terminal connecting portions 327 establish conductive paths from control terminals (gate electrodes, Kelvin emitter electrodes, sense-emitter electrodes, anode electrode and cathode electrodes) of the P-side units 302 and out of the case 100. Because in the present embodiment, a P-side unit 302 has five control electrodes, five sets of the P-side external control terminals 325 and the P-side control terminal connecting portions 327 may each be connected to any of the control electrodes. These P-side external control terminals 325 and P-side control terminal connecting portions 327 may be provided to positions opposite to the N-side external control terminals 315 and the N-side control terminal connecting portions 317 along the Y-direction.

Among them, the P-side external control terminals 325 are provided above a position between the second side portion 1122 of the frame 112 and the P-side semiconductor elements 321 or provided to the second side portion 1122. If the P-side external control terminals 325 are provided above a position between the second side portion 1122 of the frame 112 and the P-side semiconductor element 321, the P-side external control terminals 325 may for example be fixed by being embedded in the sealing material 116, or may be provided penetrating a lid portion of the case 100.

As one example, in the present embodiment, the P-side external control terminals 325 are provided to the second side portion 1122 (refer to FIG. 1). These P-side external control terminals 325 are formed into a pin-like form using metal similar to that used for the N-side external control terminals 315, and are arranged with middle portions thereof being embedded in the second side portion 1122. Also, a P-side external control terminal 325 has one end portion extending from the second side portion 1122 and a resin block 1126 and upward above the case 100, and connected to an external instrument (not illustrated). Also, the other end portion of the P-side external control terminal 325 is bent to extend from the second side portion 1122 into the case 100.

The P-side control terminal connecting portions 327 establish electrical connections between the control electrodes (gate electrodes, Kelvin emitter electrodes, sense-emitter electrodes, anode electrodes and cathode electrodes) of the P-side units 302 and the other end portions of the P-side external control terminals 325. For example, a P-side control terminal connecting portion 327 may have a bonding wire 3272 such as aluminum connected directly or indirectly through the P-side conductive layers 207 to the control electrodes of the P-side unit 302. However, a P-side control terminal connecting portion 327 may have, in place of the bonding wire 3272, a plate formed by bending a conductive metal plate. Connections between the P-side control terminal connecting portions 327 and the P-side semiconductor elements 321, 322 are mentioned in detail below using FIGS. 5 and 6.

[1-3. Electric Power Supply Portion]

The electric power supply portion 400 supplies electric power to one or more legs 300, and for example supplies positive voltage or negative voltage DC. As shown in FIG. 1, this electric power supply portion 400 may have N-side input terminals 401, P-side input terminals 402, the N-side conductive plate 404 and the P-side conductive plate 406. The N-side input terminals 401 are one example of a third external terminal, and the P-side input terminals 402 are one example of a fourth external terminal.

An N-side input terminal 401 is provided to at least one of the third side portion 1123 and the fourth side portion 1124. In the present embodiment, N-side input terminals 401 are provided to both the third side portion 1123 and the fourth side portion 1124. These N-side input terminals 401 may be connected to a negative electrode of a DC power source, and as one example, to a negative electrode of a battery.

A P-side input terminal 402 is provided to at least one of the third side portion 1123 and the fourth side portion 1124 to be closer to the second side portion 1122 than the N-side input terminal 401 is. In the present embodiment, P-side input terminals 402 are provided to both the third side portion 1123 and the fourth side portion 1124. These P-side input terminal 402 may be connected to a positive electrode of a DC power source, and as one example, to a positive electrode of a battery.

The N-side conductive plate 404 and the P-side conductive plate 406 are electrodes for allowing DC to flow through legs 300. For example, the N-side conductive plate 404 and the P-side conductive plate 406 may be printed circuit boards or conductive metal plates.

Also, the N-side conductive plate 404 may be electrically connected to the N-side inter-element connecting portions 318, respectively, provided to the upper surfaces of the N-side semiconductor elements 311, 312. The P-side conductive plate 406 may be electrically connected to the first main electrodes (collector electrodes) at the lower surfaces of the P-side semiconductor elements 321, 322 through the P-side conductive layers 207. The N-side conductive plate 404 and the P-side conductive plate 406 are mentioned in detail below.

Here, the electric power supply portion 400 or the semiconductor device 1 may have a step-up/down converter 500 for stepping up or down voltage of a DC power source and supplying the voltage to each leg 300, as shown in FIGS. 1 and 2 (refer to a central portion in the X-direction in FIG. 1). As one example, the step-up/down converter 500 has: one or more N-side semiconductor switches 501 connected to the N-side conductive plate 404; one or more P-side semiconductor switches 502 establishing connections between the N-side semiconductor switches 501 and the P-side conductive plate 406; and an intermediate terminal 503 connected between the N-side semiconductor switches 501 and the P-side semiconductor switches 502 and extending to the outside. A reactor and a DC power source may be connected in series between the intermediate terminal 503 and the N-side input terminals 401. Also, a smoothing capacitor may be connected between the P-side input terminals 402 and the N-side input terminals 401. The step-up/down converter 500 can increase induced current of the reactor by turning on the N-side semiconductor switches 501 and turning off the P-side semiconductor switches 502, and can accumulate electric charges in the smoothing capacitor and raise voltage between PN by turning off the N-side semiconductor switches 501 and turning on the P-side semiconductor switches 502. Thereby, voltage higher than the DC power source can be generated and supplied to each leg 300.

As mentioned above, in the semiconductor device 1 according to the present embodiment, the output terminals 313 are provided to the first side portion 1121 of the frame 112 that is closer to the N-side semiconductor elements 311, and the exposed portions that are in the N-side conductive layer 206 connecting with the first main electrodes (for example, collector electrodes) on the lower surface side of the N-side semiconductor elements 311, and are between the N-side semiconductor elements 311 and the output terminals 313, and the output terminals 313 are connected. Then, the N-side external control terminals 315 are provided above this connection wiring between the first main electrodes of the N-side semiconductor elements 311 and the output terminals 313 such that electrical connections are established with the control electrodes (for example, gate electrodes and the like) of the N-side semiconductor elements 311. Thereby, in the semiconductor device 1, while a simple internal connection structure is employed, the output terminals 313 through which large current flow can be caused to extend out at sufficient widths.

Also, in the semiconductor device 1, the N-side input terminals 401 and the P-side input terminals 402 are provided to the third side portion 1123 and/or the fourth side portion 1124 that are adjacent to the first side portion 1121, and the N-side conductive plate 404 that is connected to the third external terminals 401 and extends along the first side portion 1121, and the P-side conductive plate 406 that is connected to the fourth external terminals 402 and extends along the second side portion 1122 are provided. Then, the second main electrodes (for example, emitter electrodes) on the upper surface side of the N-side semiconductor elements 311 and the N-side conductive plate 404 are electrically connected, and connections are established between the N-side conductive layers 206 connecting with the first main electrodes (for example, collector electrodes) on the lower surface side of the P-side semiconductor elements 321 and the P-side conductive plate 406. Thereby, an internal connection structure from a power source terminal to a semiconductor element of each phase and each arm can be simplified, and additionally the N-side conductive plate 404 and the P-side conductive plate 406 that enable distribution from a power source can be arranged in a direction approximately orthogonal to a direction in which an output wire to an output terminal 313 of each phase is arranged, thereby enabling reduction of crosstalk between wires through which large current flows. The semiconductor device 1 is not required to include all the above-mentioned configurations, and it may include another configuration in place of the above-mentioned configurations.

[1-4. N-Side Conductive Plate and P-Side Conductive Plate]

Figure 3:
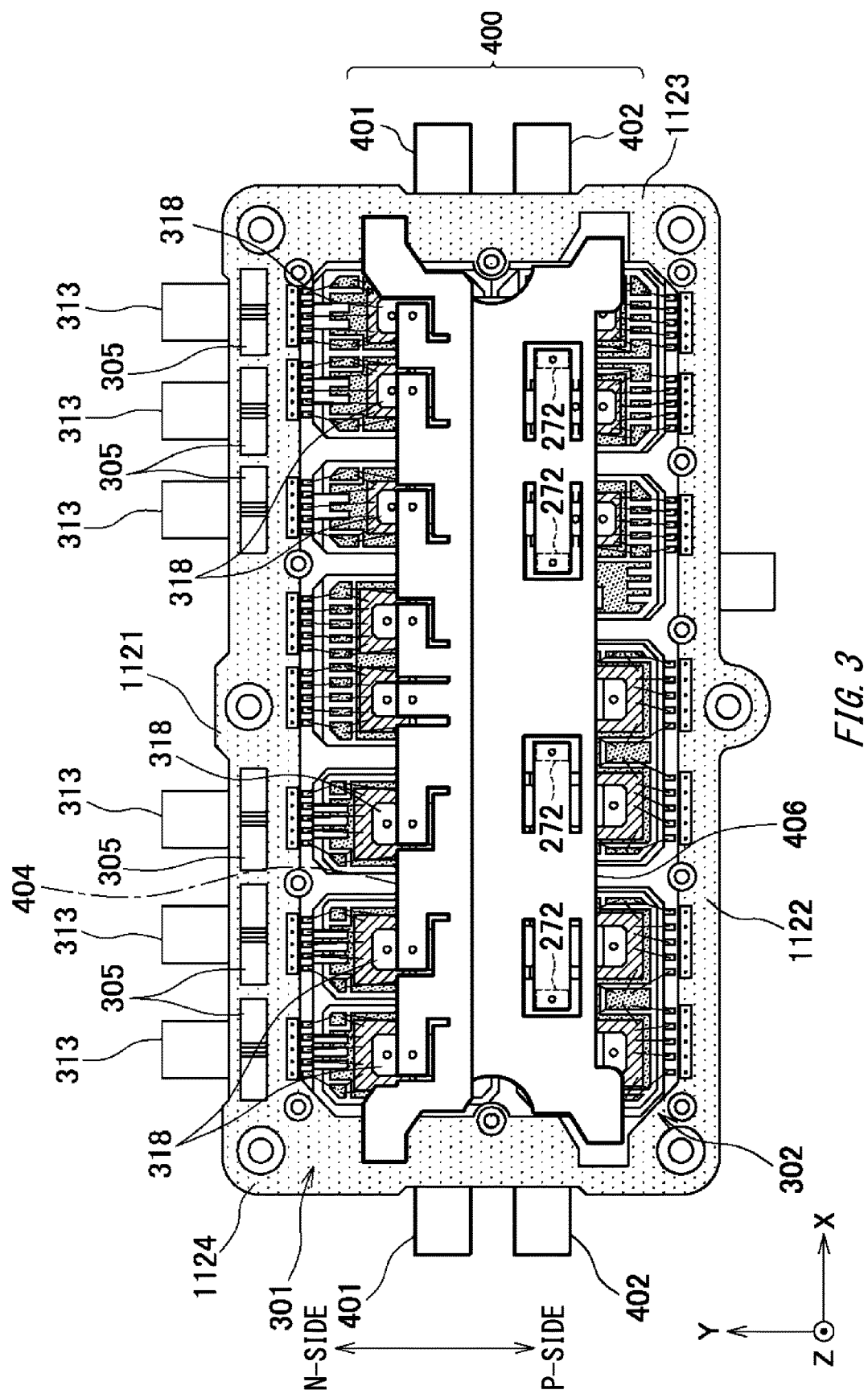
FIG. 3 is a figure showing an N-side conductive plate and a P-side conductive plate.

FIG. 3 is a figure showing the N-side conductive plate 404 and the P-side conductive plate 406. As shown in FIG. 3 and FIG. 1 mentioned above, the N-side conductive plate 404 is connected to the N-side input terminals 401, and extends above the N-side substrate 2000 and along the first side portion 1121. For example, the N-side conductive plate 404 may establish connections between the N-side input terminal 401 on the third side portion 1123 side and the N-side input terminal 401 on the fourth side portion 1124 side.

Also, the N-side conductive plate 404 is electrically connected to the second main electrodes (emitter electrodes) on the upper surfaces of the N-side semiconductor elements 311, 312 of each among a plurality of the N-side units 301. For example, the N-side conductive plate 404 may be electrically connected respectively to the N-side inter-element connecting portions 318 provided to the upper surfaces of the N-side semiconductor elements 311, 312.

The P-side conductive plate 406 is connected to the P-side input terminals 402, and extends above the P-side substrate 2001 and along the second side portion 1122. For example, the P-side conductive plate 406 may establish connections between the P-side input terminal 402 on the third side portion 1123 side and the P-side input terminal 402 on the fourth side portion 1124 side.

Also, the P-side conductive plate 406 is electrically connected to the P-side conductive layers 207 of each among a plurality of the P-side units 302. Thereby, the P-side conductive plate 406 may be electrically connected to the first main electrodes (collector electrodes) at the lower surfaces of the P-side semiconductor elements 321, 322 through the P-side conductive layers 207.

For example, the P-side conductive plate 406 may be connected to the P-side conductive layers 207 through a plurality of conductive terminals 272 disposed in place on the P-side conductive layers 207 by being electrically connected respectively to the conductive terminals 272. One conductive terminal 272 may be provided between two adjacent P-side units 302, and shared by the P-side units 302.

Here, the N-side conductive plate 404 and the P-side conductive plate 406 may extend in the array direction of a plurality of legs 300, that is, in the X-direction, and in other words may extend in the direction orthogonal to the extending direction of the N-side control terminal connecting portions 317 and the P-side control terminal connecting portions 327 and/or the direction orthogonal to the extending direction of the output terminal connecting portions 314. Thereby, the N-side conductive plate 404 and the P-side conductive plate 406 through which DC flows becomes orthogonal to the extending direction of the N-side control terminal connecting portions 317 and the P-side control terminal connecting portions 327 through which control signals flow and/or the extending direction of the output terminals 313 through which AC signals flow. Because of this, it is possible to prevent degradation of the operation characteristics of the semiconductor device 1 due to crosstalk being generated between: the N-side conductive plate 404 and the P-side conductive plate 406; and the N-side control terminal connecting portions 317 and the P-side control terminal connecting portion 327, and/or the output terminals 313.

[1-5. Connections between N-Side Control Terminal Connecting Portions and N-Side Semiconductor Elements]

In the present embodiment, the N-side external control terminals 315 are arranged closer to the N-side semiconductor elements 311 than to the N-side semiconductor elements 312. Because of this, the N-side control terminal connecting portions 317 may be connected to the N-side semiconductor elements 311 and the N-side semiconductor elements 312 in different manners.

Figure 4:
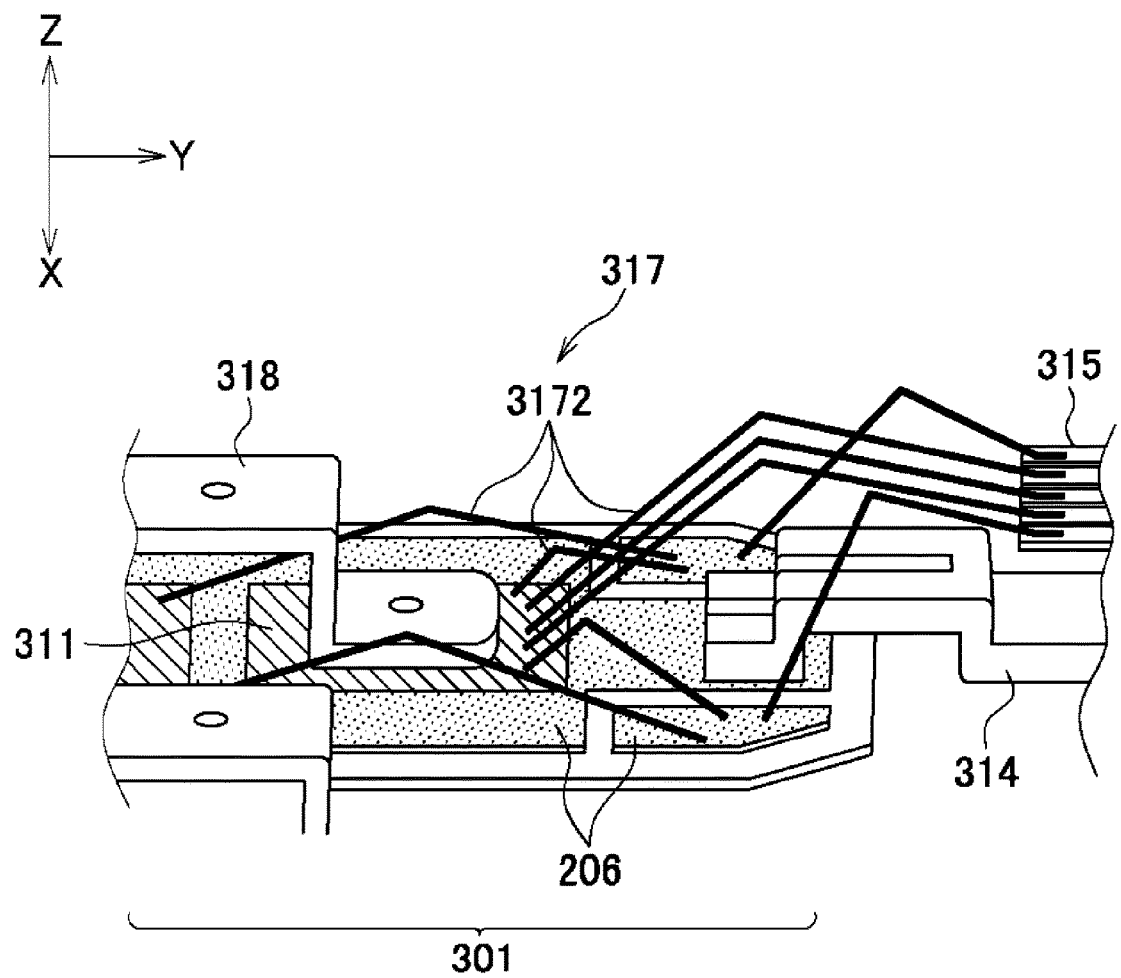
FIG. 4 is a partially enlarged view of a portion A in FIG. 2.

FIG. 4 is a partially enlarged view of a portion A in FIG. 2. As shown in FIG. 4 and FIGS. 1 and 2, an N-side control terminal connecting portion 317 may be connected to an N-side semiconductor element 311, which is closer than an N-side semiconductor element 312, at respective control electrodes (gate electrode, Kelvin emitter electrode, sense-emitter electrode, anode electrode and cathode electrode) respectively by bonding wires 3172, the number of which is equal to the number of the control electrodes (for example, five). Connections between the N-side control terminal connecting portions 317 and the N-side semiconductor elements 311 are mentioned in further detail below using FIGS. 7A to 7C.

On the other hand, the N-side control terminal connecting portion 317 may be connected to the N-side semiconductor element 312, which is farther than the N-side semiconductor element 311, at only some of the control electrodes by bonding wires 3172, the number of which is smaller than the number of the control electrodes (for example, less than five). For example, the N-side control terminal connecting portion 317 may be connected to the N-side semiconductor element 312 at only two control electrodes (for example, a gate electrode and a sense-emitter electrode) by two bonding wires 3172. Also, the N-side control terminal connecting portion 317 may be connected to the N-side semiconductor element 312 via an N-side conductive layer 206 provided adjacent to the N-side semiconductor element 311 in the X-direction. Thereby, the N-side control terminal connecting portion 317 and the N-side semiconductor element 312 can be connected while avoiding an N-side inter-element connecting portion 318 above the N-side semiconductor elements 311, 312.

[1-6. Connections between P-Side Control Terminal Connecting Portions and P-Side Semiconductor Elements]

In the present embodiment, end portions of the P-side control terminal connecting portions 327 opposite to the P-side external control terminals 325 may be connected to the P-side units 302 in different manners for respective legs 300. For example, the end portions of bonding wires 3272 in the P-side control terminal connecting portions 327 may be connected to the P-side units 302 in three legs 300 on the −X side and to the P-side units 302 in three legs 300 on the +X side in different manners.

Figure 5:
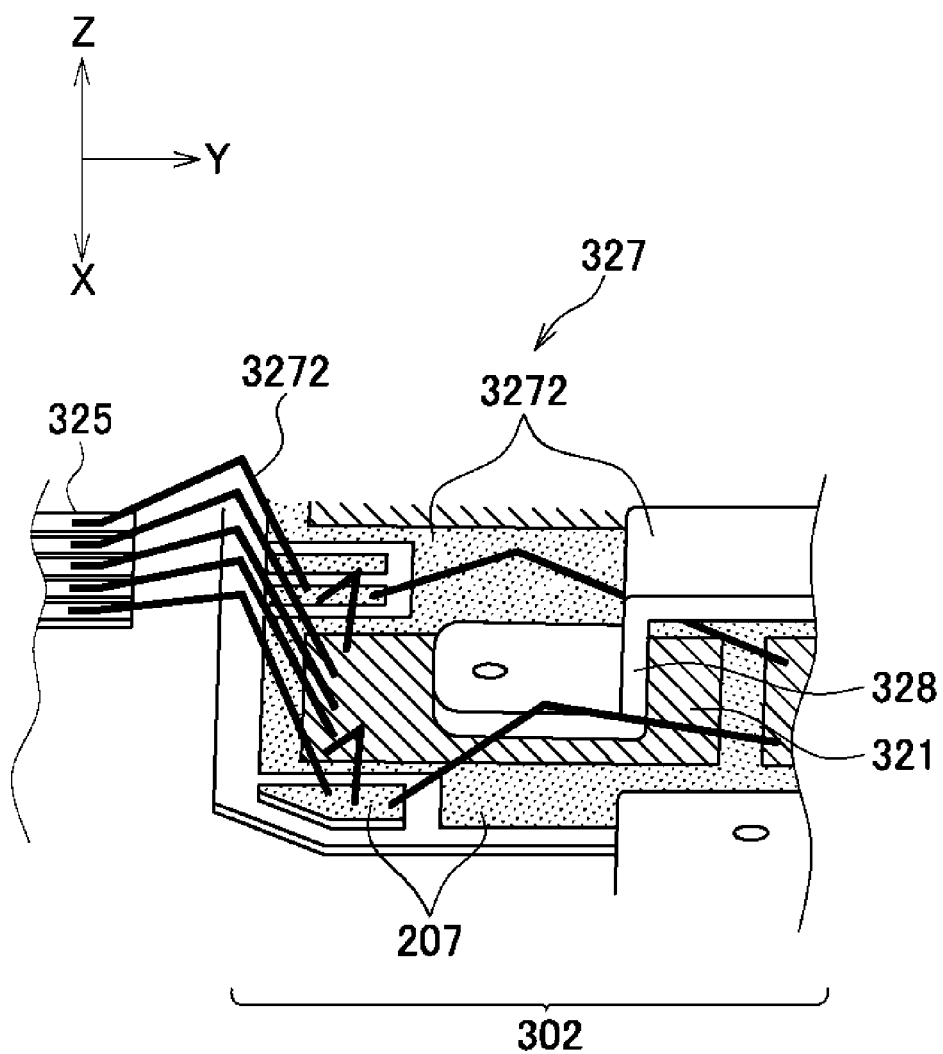
FIG. 5 is a partially enlarged view of a portion B in FIG. 2.

FIG. 5 is a partially enlarged view of a portion B in FIG. 2. As shown in FIG. 5 and FIGS. 1 and 2, in the three legs 300 on the −X side, end portions of bonding wires 3272 may be connected directly to control electrodes of the P-side units 302.

Figure 6:
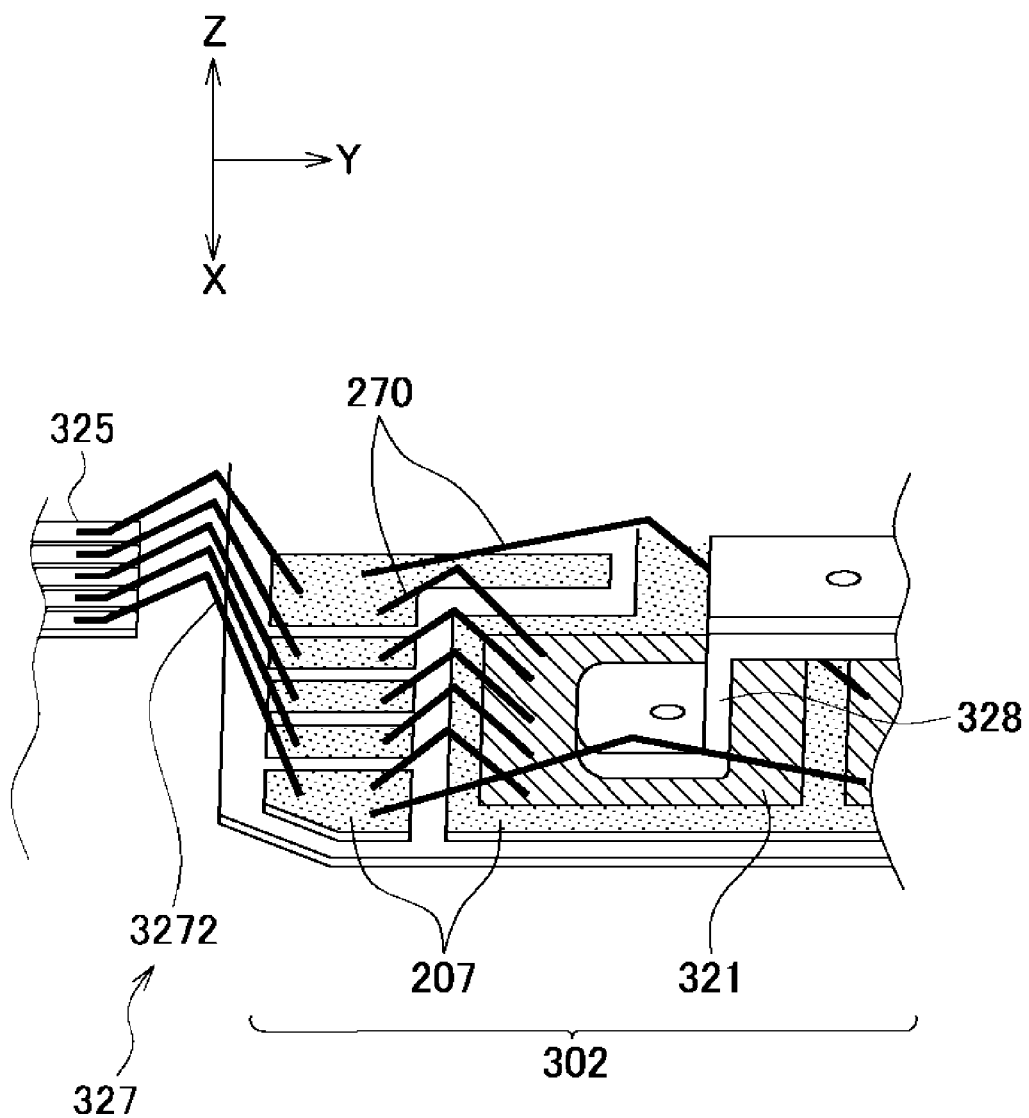
FIG. 6 is a partially enlarged view of a portion C in FIG. 2.

FIG. 6 is a partially enlarged view of a portion C in FIG. 2. As shown in FIG. 6 and FIGS. 1 and 2, in the three legs 300 on the +X side, control electrodes of the P-side units 302 are electrically and mechanically connected to bonding wires 270, and these bonding wires 270 are electrically and mechanically connected to the P-side conductive layers 207 between the second side portion 1122 of the case 100 (refer to FIG. 1) and the P-side semiconductor elements 321. Thereby, end portions of the bonding wires 3272 may be connected to the control electrodes of the P-side units 302 via electrical connections between the bonding wires 270 and the P-side conductive layers 207.

Here, in the present embodiment, the P-side external control terminals 325 are arranged closer to the P-side semiconductor elements 321 than to the P-side semiconductor elements 322. Because of this, the P-side control terminal connecting portions 327 may be connected to the P-side semiconductor elements 321 and the P-side semiconductor elements 322 in different manners. For example, a P-side control terminal connecting portion 327 may be connected to a P-side semiconductor element 322 in a similar manner to connections between the N-side control terminal connecting portions 317 and the N-side semiconductor elements 312.

[2. Cross-Sectional Structure of Semiconductor Device]

FIGS. 7A to 7C are cross-sectional views of the first side portion 1121 side in the semiconductor device 1. More specifically, FIG. 7A is a lateral cross-sectional view showing main portions of the semiconductor device 1 according to the present embodiment. In this figure, the heat sink 202, the first side portion 1121 (frame 112) of the case 100, and a resin block 1126 on the first side portion 1121 are hatched for illustration.

As shown in this figure, the frame 112 and the N-side substrate 2000 are arranged above the heat sink 202 in the semiconductor device 1. For example, the N-side substrate 2000 may be joined with the heat sink 202 through solder 110, and the frame 112 may be bonded to the heat sink 202 through a bonding layer 111.

The first side portion 1121 of the frame 112 is provided with an output terminal connecting portion 314. The output terminal connecting portion 314 is electrically connected to an exposed portion of an N-side conductive layer 206 at the N-side substrate 2000.

Also, an N-side unit 301 is arranged above the first substrate 2000, and an N-side external control terminal 315 is connected, respectively through an N-side control terminal connecting portion 317, to a plurality of control electrodes (gate electrode, Kelvin emitter electrode, sense-emitter electrode, anode electrode and cathode electrode) of the first unit 301. In the above-mentioned state, the inner space of the case 100 is filled with the sealing material 116. The lower surface of an insulating substrate 204 is provided with a heat transfer layer 203 for releasing heat from the insulating substrate 204, 205 to the heat sink 202.

Here, each set of an N-side external control terminal 315 and an N-side control terminal connecting portions 317 establish conductive paths from the control electrodes (gate electrode, Kelvin emitter electrode, sense-emitter electrode, anode electrode and cathode electrode) of the first unit 301 and out of the case 100. In at least one of, preferably every one of, such sets, an N-side external control terminal 315 is provided above a wire that is in the frame 112 and between a first main electrode (collector electrode) of an N-side semiconductor element 311 and an output terminal 313. Also, an N-side control terminal connecting portion 317 establishes connections: between control electrodes (gate electrode, Kelvin emitter electrode, sense-emitter electrode, anode electrode and cathode electrode) of the N-side semiconductor element 311 and an N-side external control terminal 315; and above a wire that is in the frame 112 and between a first main electrode (collector electrode) of an N-side semiconductor element 311 and an output terminal 313.

Thereby, as compared to a case where N-side external control terminals 315 and output terminals 313 of a plurality of legs 300 are entirely arranged side-by-side in one direction, the intervals between the N-side external control terminal 315 and the intervals between the output terminals 313 among the legs 300 can be made small. The N-side external control terminals 315 may not be embedded in the first side portion 1121 of the case 100, but may be arranged above the second main electrodes (emitter electrodes) of the N-side semiconductor elements 311.

Here, bonding wires 3172 of N-side control terminal connecting portions 317 may be wired in parallel with output terminal connecting portions 314 when seen in a top view. Thereby, N-side conductive plates 404 through which DC flows and the bonding wires 3172 through which control signals flow become orthogonal to each other. Because of this, it is possible to prevent degradation of the operation characteristics of the semiconductor device 1 due to crosstalk being generated between the N-side conductive plate 404 and the bonding wires 3172.

[2-1. Variant (1) of Cross-Sectional Structure of Semiconductor Device]

FIG. 7B is a lateral cross-sectional view of the first side portion 1121 side of the semiconductor device 1 according to a variant (1).

As shown in this figure, in an N-side unit 301 of the semiconductor device 1 in the present variant (1), an N-side control terminal connecting portion 317 has a control wiring substrate 3175 and a bonding wire 3172. In FIG. 7B and FIG. 7C which is mentioned below, the control wiring substrate 3175 is hatched for illustration.

The control wiring substrate 3175 is a substrate in which a wire (not illustrated) is formed. This control wiring substrate 3175 has one end portion embedded in the first side portion 1121, and the other end portion provided extending from the first side portion 1121 into the case 100. For example, the control wiring substrate 3175 has wires on its upper surface, the number of which is equal to the number of N-side external control terminals 316.

The control wiring substrate 3175 may be, for example, a printed circuit board including: an at least one wiring layer made of a conductive material; and a substrate made of a heat-resistant material. In the present variant (1), a resin member of the case 100 is interposed between the lower surface of the control wiring substrate 3175 and the upper surface of an output terminal connecting portion 314 below the N-side control terminal connecting portion 317. The resin member of the case 100 is insulative, and for example may be a spacer pre-formed with a resin material (polyphenylene sulfide (PPS)) of the frame 112 of the case 100 and integrally molded together with the frame 112, or may be a resin portion that fills the space between the control wiring substrate 3175 and the output terminal connecting portion 314 at the time of molding of the frame 112 and is cured therein.

In the present variant (1), the bonding wires 3172 electrically connect control electrodes (gate electrodes, Kelvin emitter electrodes, sense-emitter electrodes, anode electrodes and cathode electrodes) of the N-side semiconductor elements 311, 312 and any one among a plurality of wires of the control wiring substrate 3175. For example, a bonding wire 3172 may be connected to the above-mentioned other end portion of the control wiring substrate 3175 extending from the first side portion 1121 into the case 100.

Also, the N-side unit 301 according to the present variant (1) has the N-side external control terminals 316 in place of the N-side external control terminals 315. An N-side external control terminal 316 is formed into a pin-like form using conductive metal, is embedded in the first side portion 1121 and has one end portion extending from a portion at which it connects with the control wiring substrate 3175 and upward above the case 100. For example, the other end portion of the N-side external control terminal 316 is embedded in the first side portion 1121 while being electrically connected to a wire that is among a plurality of wires of the control wiring substrate 3175 and is connected to a corresponding bonding wire 3172. As one example, the other end portion of the N-side external control terminal 316 may be connected to a wire by being press-fit onto a through-hole formed in the control wiring substrate 3175. Also, the other end portion of the N-side external control terminal 316 may be formed into a clip-like form and connected to a wire by sandwiching an end portion of the control wiring substrate 3175. Also, the other end portion of the N-side external control terminal 316 may be soldered to a wire. In this case, wires may be provided to a surface (lower surface) of the control wiring substrate 3175 opposite to the N-side external control terminal 316, and the other end portion of the N-side external control terminal 316 may penetrate through-holes of the control wiring substrate 3175 to be soldered to the wires. However, if the N-side external control terminal 316 is soldered to a wire, epoxy resin preferably covers the soldered portion and is solidified in order to prevent solder from melting and flowing into another portion.

[2-2. Variant (2) of Cross-Sectional Structure of Semiconductor Device]

FIG. 7C is a lateral cross-sectional view of the first side portion 1121 side of the semiconductor device 1 according to a variant (2). As shown in this figure, in the present variant (2), an insulating portion on the lower surface of a control wiring substrate 3175 contacts the upper surface of an output terminal connecting portion 314 below an N-side control terminal connecting portion 317. Thereby, as compared with the case of the variant (1) in which a resin portion is interposed between the lower surface of the control wiring substrate 3175 and the output terminal connecting portion 314, the height of the semiconductor device 1 can be reduced. The insulating portion on the lower surface of the control wiring substrate 3175 may be formed of glass epoxy.

[3. Terminal Units of N-Side Control Terminal Connecting Portions and P-Side Control Terminal Connecting Portions]

Figure 8:
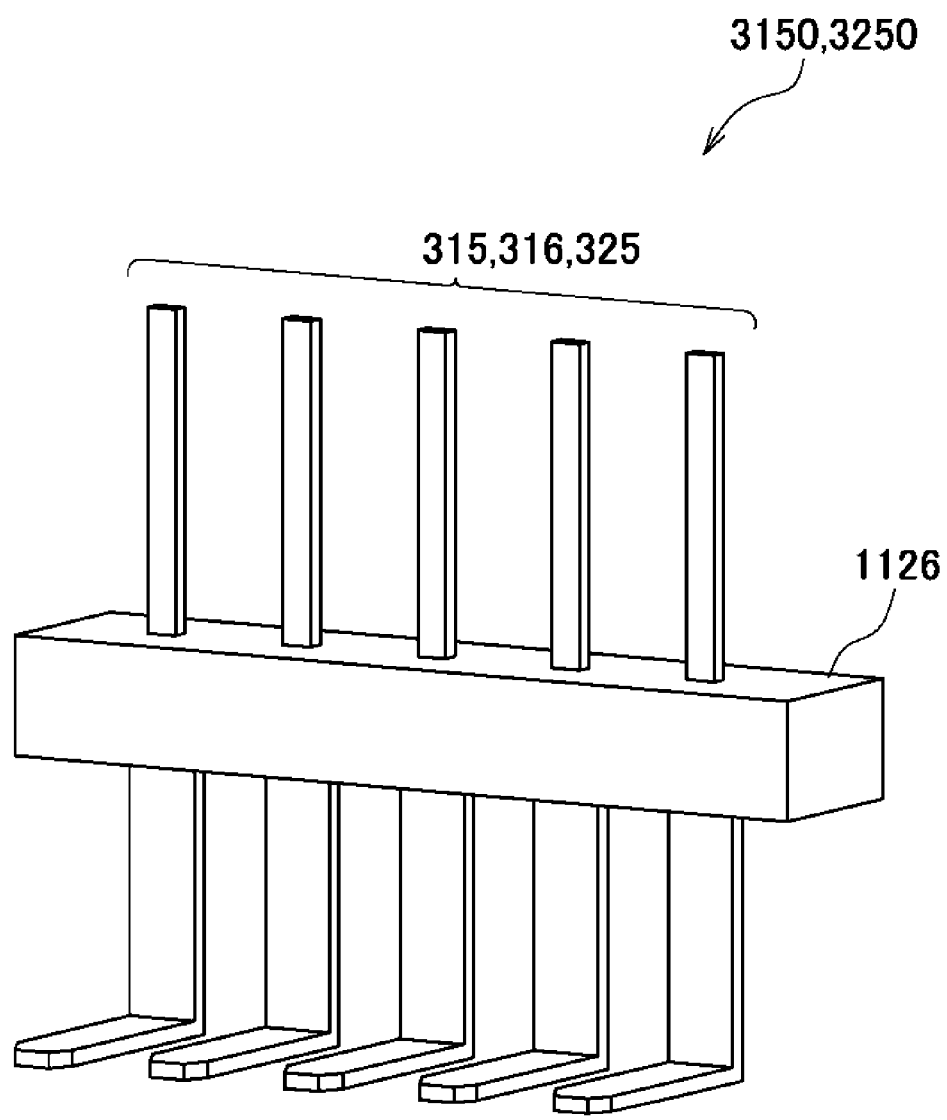
FIG. 8 is a perspective view showing terminals of an N-side control terminal connecting portion and a P-side control terminal connecting portion.

FIG. 8 is a perspective view showing N-side external control terminals 315 (or 316) and P-side external control terminals 325.

As shown in this figure, a plurality of N-side external control terminals 315 (or 316) and a plurality of P-side external control terminals 325 may be integrated as terminal units 3150, 3250, respectively. For example, a plurality of N-side external control terminals 315 (or 316) and a plurality of P-side external control terminals 325 may be integrated by a resin block 1126 provided to their respective middle portions. As one example, such terminal units 3150, 3250 can be formed by insert-molding, in which a plurality of N-side external control terminals 315 (or 316) or a plurality of P-side external control terminals 325 are arranged in a cavity and the resin block 1126 is molded. A resin material of the resin block 1126 used may be the same material or the same type of material as a resin material of the case 100.

[4. Magnetic Sensor Portion]

Figure 9:
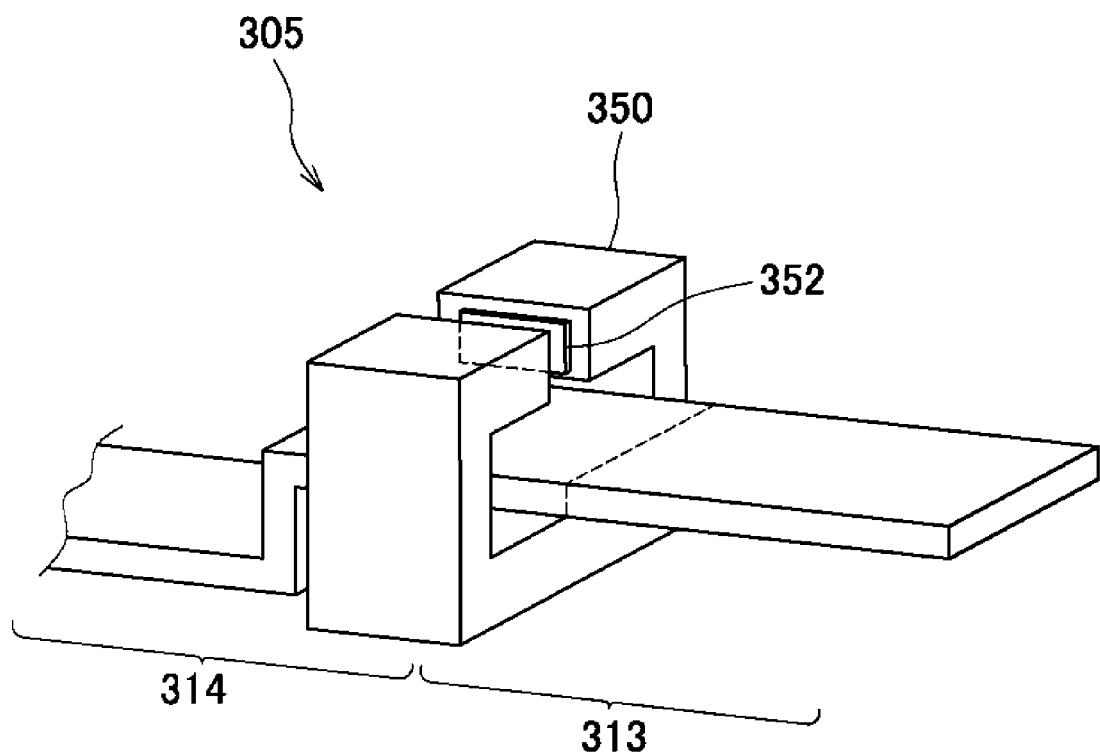
FIG. 9 is a perspective view showing a magnetic sensor portion.

FIG. 9 is a perspective view showing a magnetic sensor portion 305. As shown in this figure, a magnetic sensor portion 305 is provided to a wiring portion which is in an output terminal connecting portion 314 and between an exposed portion of an N-side conductive layer 206 and an output terminal 313.

This magnetic sensor portion 305 is provided to the outer circumference of the wiring portion, and has a magnetic core 350 having a gap (interval) at part of the outer circumference of the wiring portion and a magnetic sensor 352 arranged at the gap. The magnetic core 350 causes the magnetic field to circle around the outer circumference of the output terminal connecting portion 314, the magnetic field being generated due to current being flowing through the output terminal connecting portion 314. For example, the magnetic core 350 is formed of a magnetic material (ferrite) into a generally ring-like form, and has the gap above the wiring portion. The magnetic sensor 352 detects the magnetic flux density in the gap, and for example is a Hall element that detects the magnetic flux density and converts it to voltage.

Figure 10:
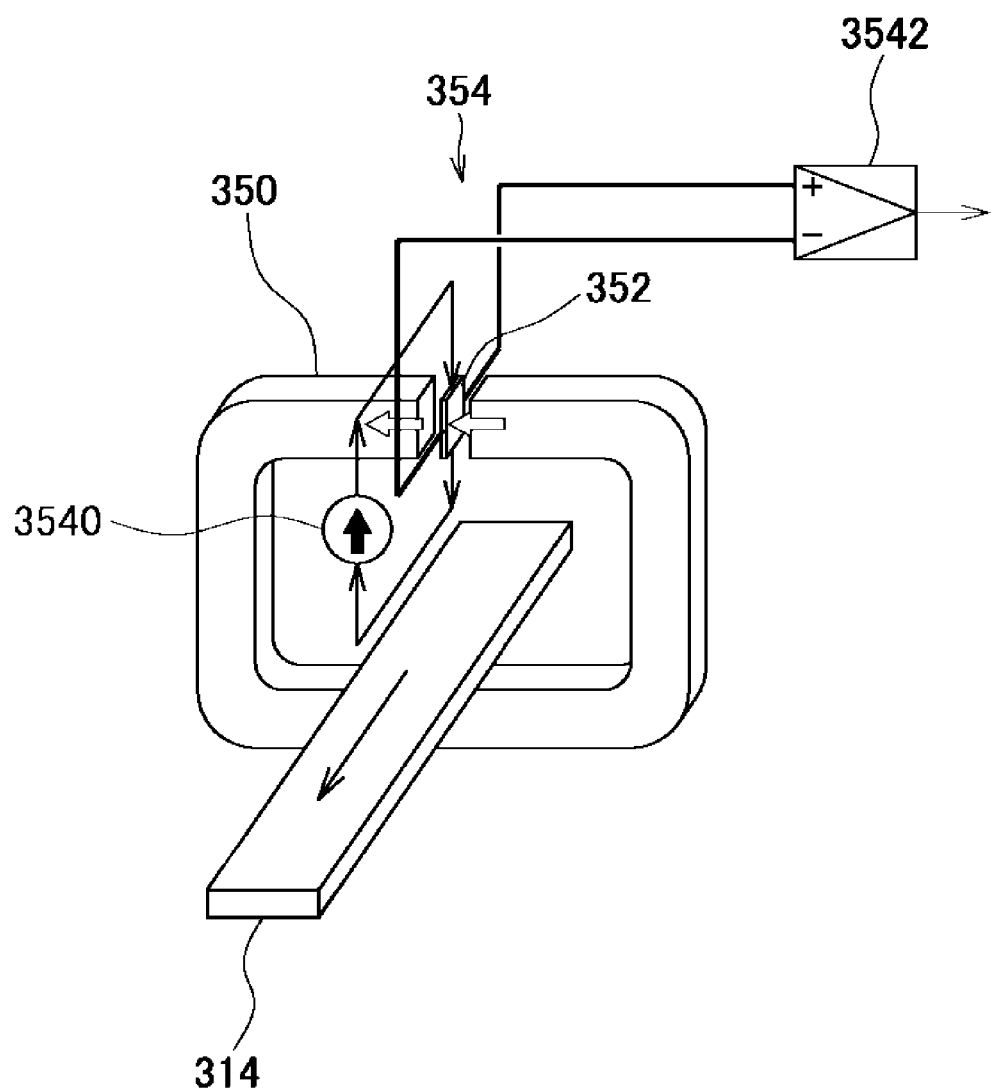
FIG. 10 is a conceptual diagram showing a usage example of the magnetic sensor portion.

FIG. 10 is a conceptual diagram showing a usage example of a magnetic sensor portion 305. As shown in this figure, a circuit 354 for current measurement is connected to the magnetic sensor portion 305. The circuit 354 has a constant current source 3540 that supplies electric power to a magnetic sensor 352 and a differential amplifier 3542 that amplifies voltage output by the magnetic sensor 352. At this magnetic sensor circuit 354, magnetic flux density proportional to the amount of current flowing through an output terminal connecting portion 314 is detected by the magnetic sensor 352 and converted into voltage, and this voltage is amplified by the differential amplifier 3542; thereby, the amount of current of the output terminal connecting portion 314 can be detected. The circuit 354 may be enclosed in the case 100, or may be arranged above the sealing material 116 or the lid portion of the case 100.

[5. Circuit Configuration][5-1. Circuit Configuration of Legs]

Figure 11:
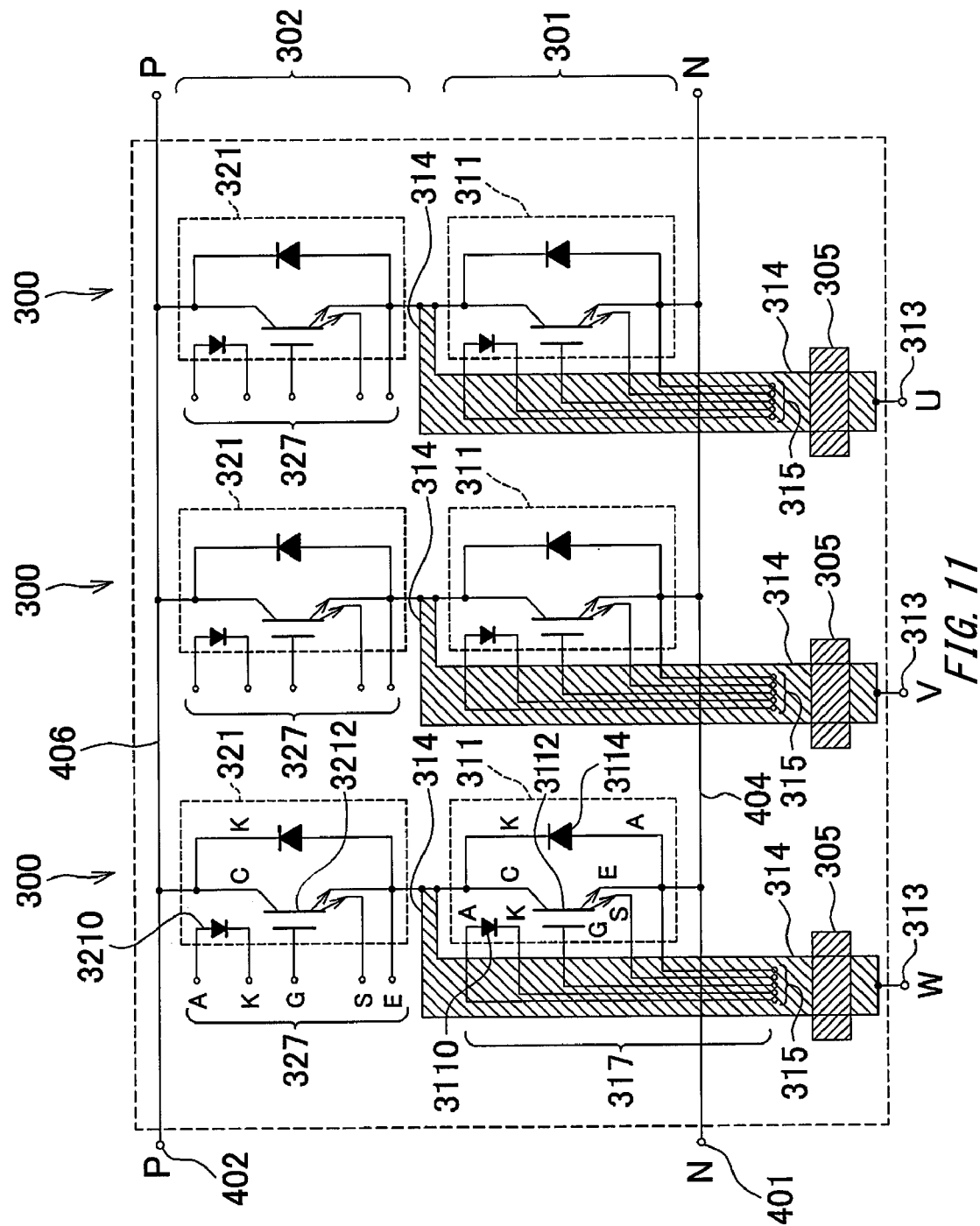
FIG. 11 is a circuit diagram showing three legs in the semiconductor device according to the present embodiment.

FIG. 11 is a circuit diagram showing three legs 300 in the semiconductor device 1 according to the present embodiment. As shown in this figure, each leg 300 has an N-side semiconductor element 311 of an N-side unit 301 as a lower arm on the N-side conductive plate 404 side, and has a P-side semiconductor element 321 of a P-side unit 302 as an upper arm on the P-side conductive plate 406 side. For simplification, in FIG. 11, illustration of an N-side semiconductor element 312 of an N-side unit 301 and a P-side semiconductor element 322 of a P-side unit 302 is omitted.

An N-side semiconductor element 311 has a temperature sensing diode 3110 and an RC-IGBT element 3112. The temperature sensing diode 3110 senses the temperature of a substrate of the N-side semiconductor element 311. This temperature sensing diode 3110 has an anode electrode (A) and a cathode electrode (K) as control electrodes on its upper surface, and is adapted to be able to measure the temperature of the substrate by measuring a forward voltage.

The RC-IGBT element 3112: has, on its upper surface, an emitter electrode (E) as a second main electrode, and a gate electrode (G), a sense-emitter electrode (S) and a Kelvin emitter electrode (E) as control electrodes; and has, on its lower surface, a collector electrode (C) as a first main electrode. The Kelvin emitter electrode (E) is electrically connected with the emitter electrode. Also, a free wheel diode 3114 that causes current to flow from the emitter electrode (E) toward the collector electrode (C) is connected between the emitter electrode (E) and the collector electrode (C).

The P-side semiconductor element 321 has a temperature sensing diode 3210 and an RC-IGBT element 3212. The temperature sensing diode 3210 senses the temperature of a substrate of the P-side semiconductor element 321, and has an anode electrode (A) and a cathode electrode (K) as control electrodes on its upper surface.

The RC-IGBT element 3212: has, on its upper surface, an emitter electrode (E) as a second main electrode, and a gate electrode (G), a Kelvin emitter electrode (E) and a sense-emitter electrode (S) as control electrodes; and has, on its lower surface, a collector electrode (C) as a first main electrode. The Kelvin emitter electrode (E) and the emitter electrode are electrically connected to each other. Also, a free wheel diode 3214 that causes current to flow from the emitter electrode (E) toward the collector electrode (C) is connected between the emitter electrode (E) and the collector electrode (C).

[5-2. Connections between Terminals]

As shown in FIG. 11 and FIGS. 1 and 2 mentioned above, the semiconductor device 1 has, at the third side portion 1123 and the fourth side portion 1124 of the case 100, the P-side input terminals 402 connected to the positive electrode of a DC power source. These P-side input terminals 402 are connected to the P-side conductive plate 406 extending along the second side portion 1122.

The P-side conductive plate 406 is connected to P-side conductive layers 207 of P-side units 302 as upper arms through a plurality of conductive terminals 272. These P-side conductive layers 207 are connected to first main electrodes (collector electrodes (C)) on the lower surfaces of P-side semiconductor elements 321.

Second main electrodes (emitter electrodes (E)) on the upper surfaces of these P-side semiconductor elements 321 are connected to N-side conductive layers 206 of N-side units 301 through P-side inter-element connecting portions 328, jumper terminals 326 and conductive terminals 260. First main electrodes (collector electrodes (C)) on the lower surfaces of N-side semiconductor elements 311 are connected to the N-side conductive layers 206.

Here, bonding wires 270, P-side control terminal connecting portions 327 and the like connect control electrodes (gate electrodes (G), Kelvin emitter electrodes (E), sense-emitter electrodes (S), anode electrodes (A) and cathode electrodes (K)) on the upper surfaces of the P-side semiconductor elements 321 to P-side external control terminals 325 of the second side portion 1122, and establish conductive paths from the control electrodes and out of the case 100.

On the other hand, the semiconductor device 1 have, at the third side portion 1123 and the fourth side portion 1124 of the case 100, the N-side input terminals 401 connected to the negative electrode of a DC power source. These N-side input terminals 401 are connected to the N-side conductive plate 404 extending along the first side portion 1121.

The N-side conductive plate 404 is electrically connected to second main electrodes (emitter electrodes (E)) on the upper surfaces of N-side semiconductor elements 311 at N-side units 301 as lower arms through a plurality of N-side inter-element connecting portions 318. First main electrodes (collector electrodes (C)) on the lower surfaces of these N-side semiconductor elements 311 are connected to the N-side conductive layers 206. Thereby, first main electrodes (collector electrodes (C)) on the lower surfaces of the N-side semiconductor elements 311 and second main electrodes (emitter electrodes (E)) on the upper surfaces of the P-side semiconductor element 321 are connected to each other through the N-side conductive layers 206.

These N-side conductive layers 206 are connected to output terminals 313 of the first side portion 1121 through output terminal connecting portions 314, and the output terminals 313 are connected to an external instrument not illustrated. The magnetic flux density of the magnetic field generated due to current flowing through the output terminal connecting portions 314 at this time is detected by the magnetic sensor portions 305.

Here, the control electrodes (gate electrodes (G), Kelvin emitter electrodes (E), sense-emitter electrodes (S), anode electrodes (A) and cathode electrodes (K)) on the upper surfaces of the N-side semiconductor elements 311 are connected to the N-side external control terminals 315 through the N-side control terminal connecting portions 317. Then, the N-side external control terminals 315 establish conductive paths from the control electrodes of the N-side semiconductor element 311 and out of the case 100.

[5-3. Operation]

In the semiconductor device 1 with such a circuit configuration, if a control signal is input to gate electrodes (G) of an N-side semiconductor element 311 and a P-side semiconductor element 321 while DC electric power is applied between an N-side input terminal 401 and a P-side input terminal 402, switching operation of RC-IGBT elements 3112, 3212 of the N-side semiconductor element 311 and the P-side semiconductor element 321 is controlled. Thereby, U-phase, V-phase and W-phase AC signals are output from output terminals 313 of three legs 300. If the temperature measured by the temperature sensing diodes 3110, 3210 is higher than a reference temperature, control may be performed to reduce heat generation by reducing emitter current, and so on.

[6. Effects of Semiconductor Device]

According to the semiconductor device 1 mentioned above, an N-side external control terminal 315 is provided above a wire that is in the frame 112 and between a first main electrode (collector electrode) of an N-side semiconductor element 311 and an output terminal 313. Also, an N-side control terminal connecting portion 317 establishes connections: between control electrodes (gate electrode, Kelvin emitter electrode, sense-emitter electrode, anode electrode and cathode electrode) of the N-side semiconductor element 311 and an N-side external control terminal 315; and above a wire that is in the frame 112 and between a first main electrode (collector electrode) of an N-side semiconductor element 311 and an output terminal 313. Accordingly, as compared to a case where N-side control terminal connecting portions 317 and output terminals 313 of a plurality of legs 300 are entirely arranged side-by-side in one direction, the intervals between the N-side external control terminal 315 and the intervals between the output terminals 313 among the legs 300 can be made small. Therefore, the semiconductor device 1 can be downsized.

Also, because the intervals between N-side external control terminals 315 and the intervals between output terminals 313 can be reduced, current paths can be shortened to reduce material costs. Also, because the width of output terminals 313 can be increased without size-increase of the semiconductor device 1, heat generation at the output terminals 313 can be reduced. Furthermore, because output terminal connecting portions 314 made of metal and harder than resin are positioned under N-side control terminal connecting portions 317, resonances of bonding wires 3172 of the N-side control terminal connecting portions 317 can be prevented, and connections can be reinforced if the bonding wires 3172 are connected to N-side external control terminals 315 utilizing ultrasonic vibration or the like.

Figure 12:
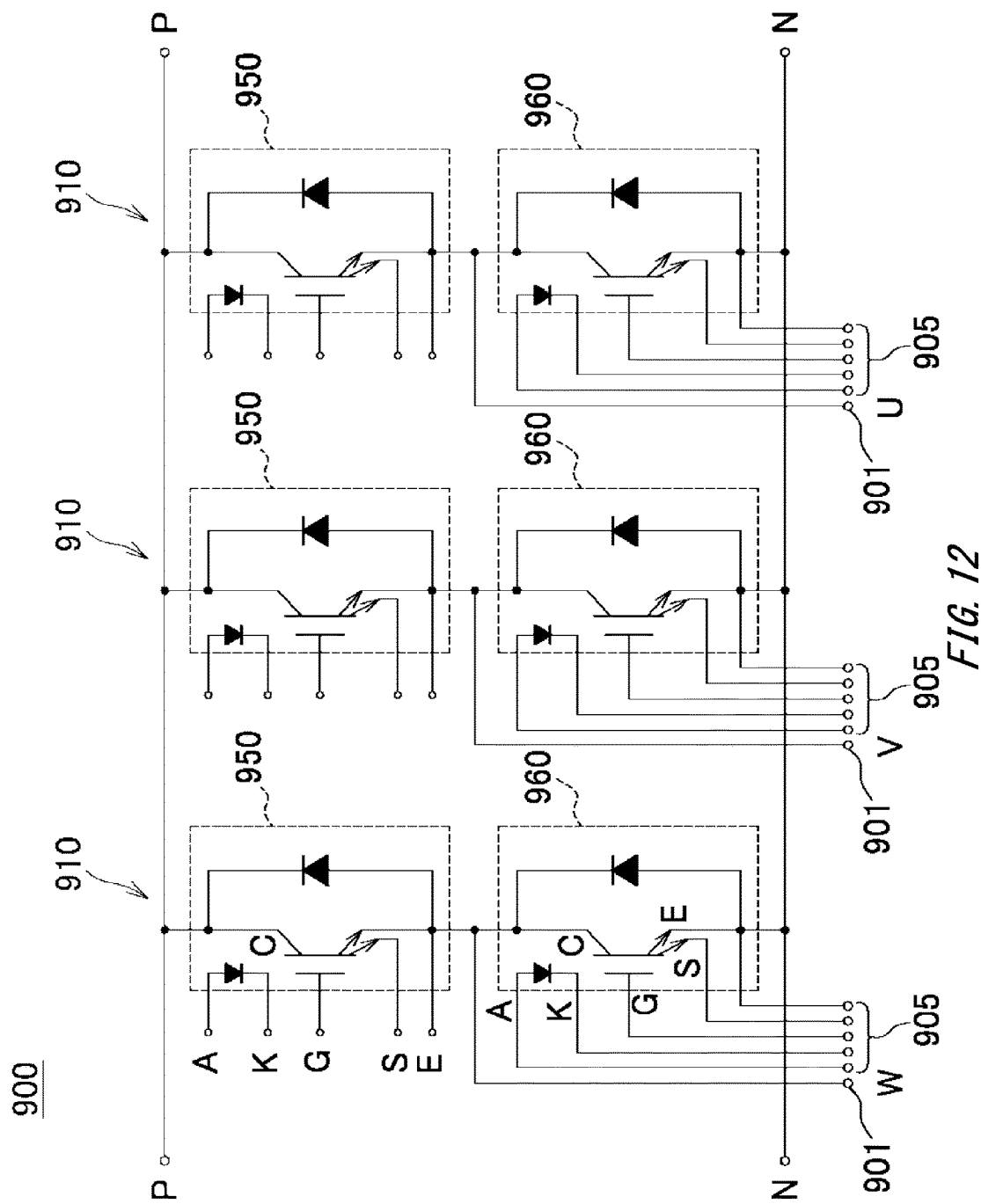
FIG. 12 is a circuit diagram showing a semiconductor device as a comparative example.

Here, a semiconductor device 900 as a comparative example is shown in FIG. 12. As shown in this figure, the semiconductor device 900 includes, at one side portion of its case, three external terminals 901 to output AC signals of three phases, U, V and W, and a leg 910 is connected to each external terminal 901. Each leg 910 has semiconductor elements 950, 960 as an upper arm and a lower arm similar to the P-side semiconductor elements 321 and the N-side semiconductor elements 311. Among them, a collector electrode (C) and an emitter electrode (E) of the semiconductor element 950 as the lower arm are connected to the external terminal 901 and a negative electrode (N) of a DC power source, respectively. Also, five external control terminals 905, respectively, establish conductive paths from a gate electrode (G), sense-emitter electrode (S), Kelvin emitter electrode (E), anode electrode (A) and cathode electrode (K) as control electrodes and out of the semiconductor device 900 at the above-mentioned one side portion. Then, in the semiconductor device 900 of the present comparative example, the five external control terminals 905 and one external terminal 901 of each of a plurality of legs 910 as a whole are arranged side-by-side in one direction. Because of this, the semiconductor device 900 increases in size as compared with the semiconductor device 1 according to the present embodiment.

[7. Semiconductor Device Manufacturing Method]

Figure 13:
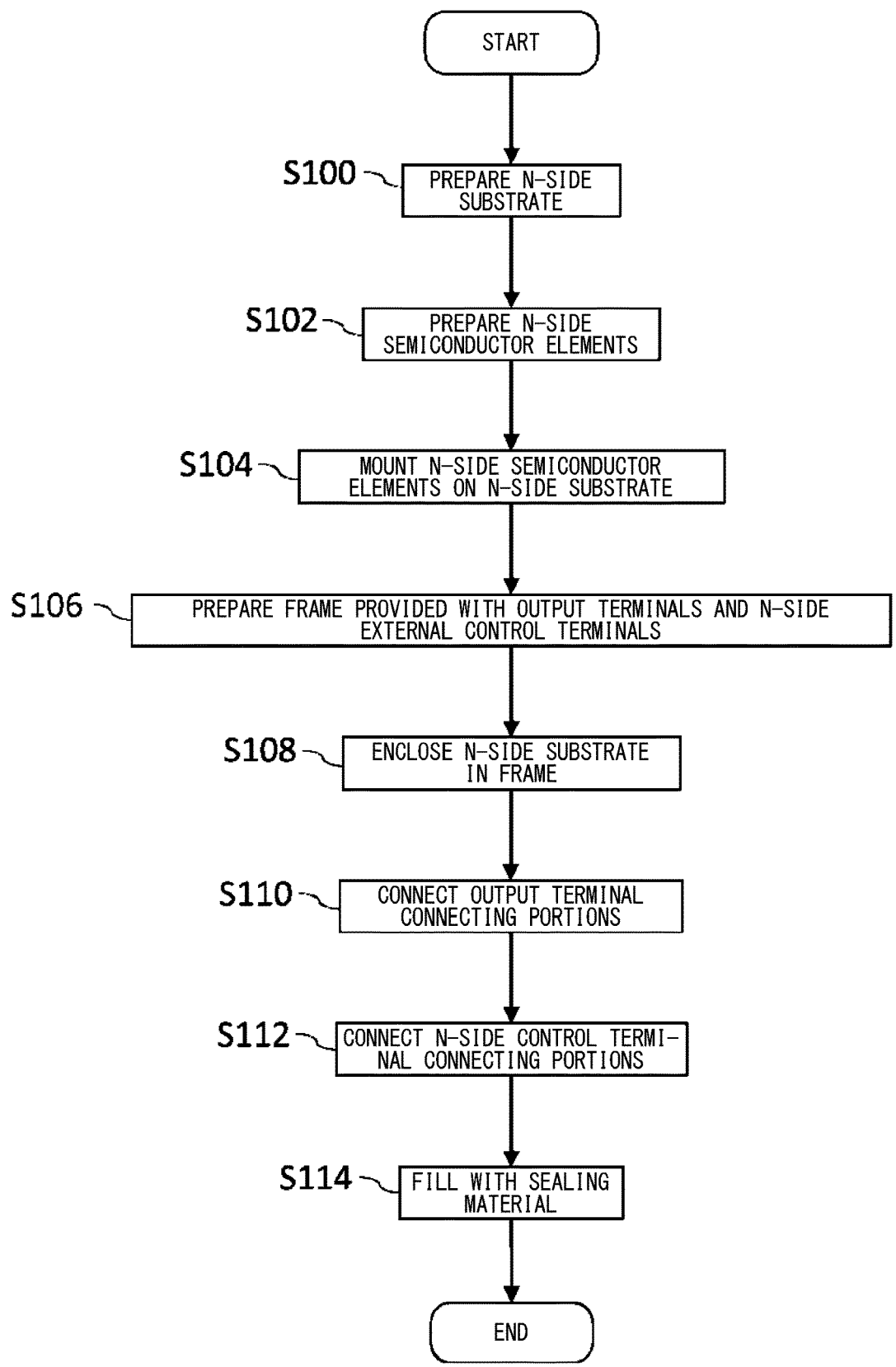
FIG. 13 is a flow chart showing a semiconductor device manufacturing method according to the present embodiment.

FIG. 13 is a flow chart showing a method of manufacturing the semiconductor device 1 according to the present embodiment. As shown in this figure, in order to form the semiconductor device 1, first, the N-side substrate 2000 and the N-side semiconductor elements 311 are prepared (S100, S102). For example, in addition to the N-side substrate 2000, the P-side substrate 2001 may be prepared, or the substrate portion 200 including them may be prepared. Also, in addition to the N-side semiconductor elements 311, the N-side semiconductor elements 312 and the P-side semiconductor elements 321, 322 may be prepared. These processes of S100 and S102 may be performed in the reverse order.

Next, the N-side semiconductor elements 311 are mounted on the N-side conductive layers 206 of the N-side substrate 2000, and the first main electrodes (collector electrodes) are connected to the N-side conductive layers 206 (S104). Also, the P-side semiconductor elements 321 may be mounted on the P-side conductive layers 207, and the first main electrodes may be connected to the P-side conductive layers 207. As one example, the N-side semiconductor elements 311 and the P-side semiconductor elements 321 are arranged and bonded such that a plurality of sets of N-side semiconductor elements 311 and P-side semiconductor elements 321 are arranged in parallel along the first side portion 1121. This bonding may be performed by means of soldering. Also, in addition to the N-side semiconductor elements 311 and the P-side semiconductor elements 321, the N-side semiconductor elements 312, 322 may also be bonded to the substrate portion 200. Also, at this time, electrical connections between second main electrodes of the N-side semiconductor elements 311, 312 may be established by the N-side inter-element connecting portions 318, and electrical connections may be established between second main electrodes of the P-side semiconductor elements 321, 322 by the P-side inter-element connecting portions 328. Furthermore, the conductive terminals 260 arranged in the N-side conductive layers 206 of the substrate portion 200 and P-side inter-element connecting portions 328 may be electrically connected by the jumper terminals 326.

Next, the frame 112 provided with the output terminals 313 and the N-side external control terminals 315 are prepared (S106). For example, in the frame 112 to be prepared, the N-side input terminals 401 and the P-side input terminals 402 may be provided to the third side portion 1123 and the fourth side portion 1124. Also, the P-side external control terminals 325 may be provided to the second side portion 1122, and the output terminal connecting portions 314, the output terminals 313 and the N-side external control terminals 315 (or 316) may be provided to the first side portion. If the N-side external control terminals 315 (or 316) are provided, the N-side external control terminals 315 (or 316) may be arranged at positions corresponding to portions above wires that are provided in the frame 112 and between the first main electrodes of the N-side semiconductor element 311 and the output terminals 313. The process of this S106 may be performed before the process of S100 or between S100 and S104.

Here, in order to prepare the frame 112, for example first, the terminal units 3150, 3250 of the N-side external control terminals 315 (or 316) and the P-side external control terminals 325 may be prepared by insert-molding. Then, the frame 112 is integrally molded such that the output terminal connecting portions 314 and the output terminals 313 are embedded in the first side portion 1121 while they are electrically connected, and above them, the terminal units 3150 of the N-side external control terminals 315 (or 316) are embedded. However, the frame 112 may be molded such that the N-side external control terminals 316 of the terminal units 3150 and the control wiring substrate 3175 are electrically connected in the first side portion 1121, and the lower surface of the control wiring substrate 3175 abuts against the output terminal connecting portions 314. If the output terminal connecting portions 314 are embedded in the first side portion 1121, in its outer circumferential portion, the magnetic cores 350 and the magnetic sensors 352 of the magnetic sensor portions 305 may be disposed in place and are embedded in the first side portion 1121, and terminals of the magnetic sensors 352 may be caused to protrude into or out of the case 100. If the frame 112 is molded in the above-mentioned manner, the N-side input terminals 401 and the P-side input terminals 402 are embedded in the third side portion 1123 and the fourth side portion 1124, and the P-side external control terminals 325 are embedded in the second side portion 1122.

Next, the N-side substrate 2000 is enclosed in the frame 112 (S108). For example, the substrate portion 200 on which the N-side semiconductor elements 311, the P-side semiconductor elements 321 and the like are mounted may be enclosed in the frame 112. As one example, the N-side substrate 2000 and the like may be enclosed in the frame 112 by bonding, to the lower surface of the frame 112, the heat sink 202 to which the N-side substrate 2000 and the P-side substrate 2001 are joined by means of soldering or the like.

Next, connections are established between the exposed portions of the N-side conductive layers 206 between the N-side semiconductor elements 311 and the output terminals 313 and the output terminals 313 by the output terminal connecting portions 314 (S110). These connections may be established by soldering, welding (laser welding, ultrasonic welding, etc.) or the like.

Next, connections are established: between the control electrodes of the N-side semiconductor elements 311 and the N-side external control terminals 315 by the N-side control terminal connecting portions 317; and above wires between the first main electrodes of the N-side semiconductor elements 311 and the output terminals 313 (S112). For example, one end of a bonding wire 3172 is connected to a control electrode on the upper surface of an N-side semiconductor element 311 or the like. Also, the other end of this bonding wire 3172 is connected to an N-side external control terminal 315 (or 316) above a wire between a first main electrode (collector electrode) of an N-side semiconductor element 311 and an output terminal 313. The connection between the bonding wire 3172 and the N-side external control terminal 315 (or 316) may be established by soldering, welding or the like, and the connection between the bonding wire 3172 and the control electrode of the N-side semiconductor element 311 may be established by soldering or the like.

At this S112, connections between the control electrodes of the N-side semiconductor elements 312 and the N-side external control terminals 315 may be established by the N-side control terminal connecting portions 317. Also, connections between control electrodes of the P-side semiconductor elements 321, 322 and the P-side external control terminals 325 may be established by the P-side control terminal connecting portions 327. In this case, for example, the P-side external control terminals 325 and the control electrodes on the upper surfaces of the P-side semiconductor elements 321 and the like are connected by the bonding wires 3272. The connections between the bonding wire 3272 and the P-side external control terminals 325 may be established by soldering, welding or the like, and the connections between the bonding wires 3272 and the control electrodes of the P-side semiconductor elements 321 may be established by soldering or the like.

Also, the N-side conductive plate 404 and the P-side conductive plate 406 may be arranged in the case 100. For example, the N-side conductive plate 404 is electrically connected to the N-side input terminals 401 of the third side portion 1123 and the fourth side portion 1124, respectively, and are arranged at an upper portion in the case 100 while they are arrayed along the first side portion 1121. Also, the N-side conductive plate 404 and a plurality of N-side inter-element connecting portions 318 are also electrically and mechanically connected by means of soldering, welding or the like. Thereby, the N-side conductive plate 404 and the second main electrodes on the upper surfaces of the N-side semiconductor elements 311 are electrically connected.

Also, for example, the P-side conductive plate 406 is electrically connect to the P-side input terminals 402 of the third side portion 1123 and the fourth side portion 1124, respectively, and are arranged at an upper portion in the case 100 while they are arrayed along the second side portion 1122. Also, the P-side conductive plate 406 and a plurality of conductive terminals 272 disposed in place on the P-side conductive layers 207 are also electrically and mechanically connected by means of soldering, welding or the like. Thereby, the P-side conductive plate 406 and the first main electrodes on the lower surfaces of the P-side semiconductor elements 321 are electrically connected.

Then, the inner space of the case 100 is filled with the sealing material 116 (S114). For example, the inner space of the case 100 may be filled with the sealing material 116 such as epoxy resin, which is then solidified. Thereby, the semiconductor device 1 is manufactured.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device comprising:
   a frame;
   a first external terminal that is provided to a first side portion of the frame;
   a first substrate that is enclosed in the frame and has a first conductive layer at an upper surface thereof;
   a first semiconductor element that: is mounted on the first conductive layer; has, on a lower surface thereof, a first main electrode connecting with the first conductive layer; and has a second main electrode and a control electrode on an upper surface thereof;
   a first terminal connecting portion that establishes a connection between the first external terminal and an exposed portion of the first conductive layer between the first semiconductor element and the first external terminal;
   a first external control terminal that is provided above a wire that is in the frame and between the first main electrode of the first semiconductor element and the first external terminal; and
   a first control terminal connecting portion that establishes a connection: between the control electrode of the first semiconductor element and the first external control terminal; and above the wire between the first main electrode of the first semiconductor element and the first external terminal, wherein
   an upper surface of the first conductive layer contacts a lower surface of the first terminal connecting portion.

2. The semiconductor device according to claim 1, wherein the first control terminal connecting portion has a bonding wire that establishes an electrical connection between the control electrode of the first semiconductor element and the first external control terminal.

3. The semiconductor device according to claim 1, wherein
   the first control terminal connecting portion has:
   a control wiring substrate including a control wiring layer connected to the first external control terminal; and
   a bonding wire that electrically connects the control electrode of the first semiconductor element and the control wiring layer of the control wiring substrate.

4. The semiconductor device according to claim 3, wherein the first external control terminal extends from the control wiring substrate to above the frame.

5. The semiconductor device according to claim 3, wherein a resin member of the frame is provided between a lower surface of the control wiring substrate and an upper surface of the first terminal connecting portion.

6. The semiconductor device according to claim 3, wherein an insulating portion of a lower surface of the control wiring substrate contacts an upper surface of the first terminal connecting portion.

7. The semiconductor device according to claim 2, wherein
   the first semiconductor element has a plurality of the control electrodes, and
   each among a plurality of the first external control terminals electrically connected to each among the plurality of the control electrodes of the first semiconductor element is provided above at least one among wires between the first main electrode of the first semiconductor element and the first external terminal.

8. The semiconductor device according to claim 2, wherein the bonding wire is wired in parallel with the first terminal connecting portion when seen in a top view.

9. The semiconductor device according to claim 1, further comprising:
   a second substrate that: is enclosed between a second side portion of the frame that is opposite to the first side portion and the first substrate; and has a second conductive layer at an upper surface thereof; and
   a second semiconductor element that: is mounted on the second conductive layer; has, on a lower surface thereof, a first main electrode connected to the second conductive layer; and a second main electrode and a control electrode on an upper surface thereof, wherein the second main electrode of the second semiconductor element and the first conductive layer are electrically connected.

10. The semiconductor device according to claim 9, further comprising:
a second external control terminal provided: above a position between the second side portion of the frame and the second semiconductor element; or to the second side portion; and
a second control terminal connecting portion that establishes a connection between the control electrode of the second semiconductor element and the second external control terminal.

11. The semiconductor device according to claim 10, wherein a plurality of sets each having: a first unit including the first external terminal, the first external control terminal, the first semiconductor element, the first terminal connecting portion and the first control terminal connecting portion; and a second unit including the second external control terminal, the second semiconductor element and the second control terminal connecting portion are arranged in parallel along the first side portion.

12. A semiconductor device comprising:
a frame;
a first external terminal that is provided to a first side portion of the frame;
a first substrate that is enclosed in the frame and has a first conductive layer at an upper surface thereof;
a first semiconductor element that: is mounted on the first conductive layer; has, on a lower surface thereof, a first main electrode connecting with the first conductive layer; and has a second main electrode and a control electrode on an upper surface thereof;
a first terminal connecting portion that establishes a connection between the first external terminal and an exposed portion of the first conductive layer between the first semiconductor element and the first external terminal;
a first external control terminal that is provided above a wire that is in the frame and between the first main electrode of the first semiconductor element and the first external terminal;
a first control terminal connecting portion that establishes a connection: between the control electrode of the first semiconductor element and the first external control terminal; and above the wire between the first main electrode of the first semiconductor element and the first external terminal;
a second substrate that: is enclosed between a second side portion of the frame that is opposite to the first side portion and the first substrate; and has a second conductive layer at an upper surface thereof;
a second semiconductor element that: is mounted on the second conductive layer; has, on a lower surface thereof, a first main electrode connected to the second conductive layer; and a second main electrode and a control electrode on an upper surface thereof;
a second external control terminal provided: above a position between the second side portion of the frame and the second semiconductor element; or to the second side portion;
a second control terminal connecting portion that establishes a connection between the control electrode of the second semiconductor element and the second external control terminal;
a third external terminal provided to at least one of: a third side portion of the frame between the first side portion and the second side portion; and a fourth side portion opposite to the third side portion;
a first conductive plate that is connected to the third external terminal and extends along the first side portion above the first substrate;
a fourth external terminal that is provided to at least one of the third side portion and the fourth side portion and closer to the second side portion than the third external terminal is; and
a second conductive plate that is connected to the fourth external terminal and extends along the second side portion above the second substrate, wherein
the second main electrode of the second semiconductor element and the first conductive layer are electrically connected,
a plurality of sets each having: a first unit including the first external terminal, the first external control terminal, the first semiconductor element, the first terminal connecting portion and the first control terminal connecting portion; and a second unit including the second external control terminal, the second semiconductor element and the second control terminal connecting portion are arranged in parallel along the first side portion,
the second main electrode of the first semiconductor element in each among a plurality of the first units is electrically connected to the first conductive plate, and
the second conductive layer in each among a plurality of the second units is electrically connected to the second conductive plate.

13. The semiconductor device according to claim 12, wherein
the first conductive plate establishes a connection between the third external terminal on the third side portion side and the third external terminal on the fourth side portion side, and
the second conductive plate establishes a connection between the fourth external terminal on the third side portion side and the fourth external terminal on the fourth side portion side.

14. The semiconductor device according to claim 12, wherein the first conductive plate and the second conductive plate extend in a direction orthogonal to an extending direction of the first terminal connecting portion.

15. The semiconductor device according to claim 14, wherein at least the fourth external terminal among the third external terminal and the fourth external terminal, and the first external terminal are exposed out of the frame in orthogonal directions in a planar view.

16. The semiconductor device according to claim 12, wherein
the first external terminal is an output terminal,
the third external terminal is a power source input terminal on a negative side, and
the fourth external terminal is a power source input terminal on a positive side.

17. The semiconductor device according to claim 11, wherein
the semiconductor device is an inverter device,
the first unit constitutes a lower arm of the inverter device, and the second unit constitutes an upper arm of the inverter device.

18. The semiconductor device according to claim 1, comprising:
a third semiconductor element that: is mounted on the first conductive layer of the first substrate in parallel with the first semiconductor element on an opposite side to the first external terminal relative to the first semiconductor element; has, at a lower surface thereof, a first main electrode connecting with the first conductive layer; and has a second main electrode and a control electrode on an upper surface thereof; and
a first inter-semiconductor element connecting portion that establishes a connection between the second main electrode of the first semiconductor element and the second main electrode of the third semiconductor element.

19. A semiconductor device comprising:
a frame;
a first external terminal that is provided to a first side portion of the frame;
a first substrate that is enclosed in the frame and has a first conductive layer at an upper surface thereof;
a first semiconductor element that: is mounted on the first conductive layer; has, on a lower surface thereof, a first main electrode connecting with the first conductive layer; and has a second main electrode and a control electrode on an upper surface thereof;
a first terminal connecting portion that establishes a connection between the first external terminal and an exposed portion of the first conductive layer between the first semiconductor element and the first external terminal;
a first external control terminal that is provided above a wire that is in the frame and between the first main electrode of the first semiconductor element and the first external terminal;
a first control terminal connecting portion that establishes a connection: between the control electrode of the first semiconductor element and the first external control terminal; and above the wire between the first main electrode of the first semiconductor element and the first external terminal;
a magnetic core that: is provided to an outer circumference of a wiring portion that is in the first terminal connecting portion and between the exposed portion of the first conductive layer and the first external terminal; and has a gap at part of the outer circumference of the wiring portion; and
a magnetic sensor arranged at the gap of the magnetic core.

20. The semiconductor device according to claim 1, wherein the first terminal connecting portion establishes a connection between: an exposed portion at an end portion of the first conductive layer on the first side portion side; and the first external terminal.

21. A semiconductor device manufacturing method comprising:
preparing a first substrate having a first conductive layer on an upper surface thereof;
preparing a first semiconductor element that: has a first main electrode on a lower surface thereof; and has a second main electrode and a control electrode on an upper surface thereof;

mounting the first semiconductor element on the first conductive layer and connecting the first main electrode to the first conductive layer;
preparing a frame that is: provided with a first external terminal at a first side portion; and provided with a first external control terminal at a position corresponding to a portion above a wire provided between the first main electrode of the first semiconductor element and the first external terminal;
causing the first substrate to be enclosed in the frame;
establishing, by a first terminal connecting portion, a connection between: an exposed portion of the first conductive layer between the first semiconductor element and the first external terminal; and the first external terminal such that an upper surface of the first conductive layer contacts a lower surface of the first terminal connecting portion; and
establishing, by a first control terminal connecting portion, a connection: between the control electrode of the first semiconductor element and the first external control terminal; and above a wire between the first main electrode of the first semiconductor element and the first external terminal.

22. A semiconductor device comprising:
a frame;
a first external terminal that is provided to a first side portion of the frame;
a first substrate that is enclosed in the frame and has a first conductive layer at an upper surface thereof;
a first semiconductor element that: is mounted on the first conductive layer; has, on a lower surface thereof, a first main electrode connecting with the first conductive layer; and has a second main electrode and a control electrode on an upper surface thereof;
a first terminal connecting portion that establishes a connection between the first external terminal and an exposed portion of the first conductive layer between the first semiconductor element and the first external terminal;
a first external control terminal that is provided above a wire that is in the frame and between the first main electrode of the first semiconductor element and the first external terminal; and
a first control terminal connecting portion that establishes a connection: between the control electrode of the first semiconductor element and the first external control terminal; and above the wire between the first main electrode of the first semiconductor element and the first external terminal, wherein
the first control terminal connecting portion has:
a control wiring substrate including a control wiring layer connected to the first external control terminal; and
a bonding wire that electrically connects the control electrode of the first semiconductor element and the control wiring layer of the control wiring substrate, wherein the control wiring substrate has one end portion embedded in the first side portion, and another end portion provided extending from the first side portion into the frame.

* * * * *